(12) United States Patent
Umezaki et al.

(10) Patent No.: US 11,222,906 B2
(45) Date of Patent: Jan. 11, 2022

(54) DISPLAY DEVICE, SEMICONDUCTOR DEVICE, AND DRIVING METHOD THEREOF

(71) Applicant: Semiconductor Energy Laboratory Co., Ltd., Atsugi (JP)

(72) Inventors: Atsushi Umezaki, Kanagawa (JP); Hajime Kimura, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/809,663

(22) Filed: Mar. 5, 2020

(65) Prior Publication Data

US 2020/0203387 A1   Jun. 25, 2020

Related U.S. Application Data

(60) Continuation of application No. 15/680,348, filed on Aug. 18, 2017, now abandoned, which is a
(Continued)

(30) Foreign Application Priority Data

Feb. 23, 2010   (JP) ................................. 2010-036902

(51) Int. Cl.
*G11C 19/00*    (2006.01)
*H01L 27/12*    (2006.01)
(Continued)

(52) U.S. Cl.
CPC ........... *H01L 27/1225* (2013.01); *G09G 3/20* (2013.01); *G09G 3/3674* (2013.01);
(Continued)

(58) Field of Classification Search
None
See application file for complete search history.

(56) References Cited

U.S. PATENT DOCUMENTS

| 5,517,542 A | 5/1996 | Huq |
| 5,731,856 A | 3/1998 | Kim et al. |
| | (Continued) | |

FOREIGN PATENT DOCUMENTS

| CN | 001677564 A | 10/2005 |
| CN | 101017656 A | 8/2007 |
| | (Continued) | |

OTHER PUBLICATIONS

International Search Report (Application No. PCT/JP2011/052078) dated Apr. 12, 2011.
(Continued)

*Primary Examiner* — Tuan T Lam
(74) *Attorney, Agent, or Firm* — Fish & Richardson P.C.

(57) ABSTRACT

An object is to provide a semiconductor device with improved operation. The semiconductor device includes a first transistor, and a second transistor electrically connected to a gate of the first transistor. A first terminal of the first transistor is electrically connected to a first line. A second terminal of the first transistor is electrically connected to a second line. The gate of the first transistor is electrically connected to a first terminal or a second terminal of the second transistor.

12 Claims, 14 Drawing Sheets

Related U.S. Application Data continuation of application No. 14/885,353, filed on Oct. 16, 2015, now abandoned, which is a division of application No. 14/085,864, filed on Nov. 21, 2013, now abandoned, which is a continuation of application No. 13/025,479, filed on Feb. 11, 2011, now Pat. No. 8,599,998.

(51) Int. Cl.
  *G11C 19/28* (2006.01)
  *G09G 3/36* (2006.01)
  *G09G 3/20* (2006.01)
  *H01L 29/786* (2006.01)

(52) U.S. Cl.
  CPC .......... *G09G 3/3677* (2013.01); *G11C 19/28* (2013.01); *G11C 19/287* (2013.01); *H01L 27/124* (2013.01); *H01L 29/7869* (2013.01); *G09G 2310/0286* (2013.01)

(56) References Cited

U.S. PATENT DOCUMENTS

| | | |
|---|---|---|
| 5,744,864 A | 4/1998 | Cillessen et al. |
| 6,052,426 A | 4/2000 | Maurice |
| 6,294,274 B1 | 9/2001 | Kawazoe et al. |
| 6,563,174 B2 | 5/2003 | Kawasaki et al. |
| 6,611,248 B2 | 8/2003 | Kanbara et al. |
| 6,727,522 B1 | 4/2004 | Kawasaki et al. |
| 6,774,419 B2 | 8/2004 | Kimura |
| 6,813,332 B2 | 11/2004 | Nagao et al. |
| 6,845,140 B2 | 1/2005 | Moon et al. |
| 6,876,353 B2 | 4/2005 | Morosawa et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,106,292 B2 | 9/2006 | Moon |
| 7,116,748 B2 | 10/2006 | Nagao et al. |
| 7,202,863 B2 | 4/2007 | Kimura et al. |
| 7,211,825 B2 | 5/2007 | Shih et al. |
| 7,224,629 B2 | 5/2007 | Akiyama et al. |
| 7,282,782 B2 | 10/2007 | Hoffman et al. |
| 7,297,977 B2 | 11/2007 | Hoffman et al. |
| 7,319,452 B2 | 1/2008 | Moon |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,486,269 B2 | 2/2009 | Moon |
| 7,492,655 B2 | 2/2009 | Akiyama et al. |
| RE40,673 E | 3/2009 | Kanbara et al. |
| 7,501,293 B2 | 3/2009 | Ito et al. |
| 7,629,612 B2 | 12/2009 | Kimura |
| 7,636,412 B2 | 12/2009 | Tobita |
| 7,674,650 B2 | 3/2010 | Akimoto et al. |
| 7,696,974 B2 | 4/2010 | Moon et al. |
| 7,697,655 B2 * | 4/2010 | Chan ................... G11C 19/28 377/64 |
| 7,732,819 B2 | 6/2010 | Akimoto et al. |
| 7,742,064 B2 | 6/2010 | Kimura |
| 7,786,985 B2 | 8/2010 | Kimura et al. |
| 7,787,585 B2 * | 8/2010 | Cheng ................... G11C 19/28 377/64 |
| 7,791,074 B2 | 9/2010 | Iwasaki |
| 7,800,575 B2 | 9/2010 | Nakao et al. |
| 7,800,576 B2 | 9/2010 | Jinta |
| 7,843,751 B2 | 11/2010 | Akiyama et al. |
| 7,852,309 B2 | 12/2010 | Chung |
| 7,859,491 B2 | 12/2010 | Lee et al. |
| 7,910,490 B2 | 3/2011 | Akimoto et al. |
| 7,923,723 B2 | 4/2011 | Hayashi et al. |
| 7,932,521 B2 | 4/2011 | Akimoto et al. |
| 7,936,332 B2 | 5/2011 | Lee et al. |
| 7,961,159 B2 | 6/2011 | Kimura |
| 7,978,274 B2 | 7/2011 | Umezaki et al. |
| 8,044,906 B2 | 10/2011 | Kimura et al. |
| 8,054,279 B2 | 11/2011 | Umezaki et al. |
| 8,059,078 B2 | 11/2011 | Kimura et al. |
| 8,129,717 B2 | 3/2012 | Yamazaki et al. |
| 8,199,596 B2 | 6/2012 | Akiyama et al. |
| 8,212,257 B2 | 7/2012 | Kimura |
| 8,274,077 B2 | 9/2012 | Akimoto et al. |
| 8,288,768 B2 | 10/2012 | Kim et al. |
| 8,314,754 B2 | 11/2012 | Kimura |
| 8,314,765 B2 | 11/2012 | Umezaki |
| 8,351,563 B2 | 1/2013 | Yang et al. |
| 8,456,402 B2 | 6/2013 | Kimura et al. |
| 8,466,463 B2 | 6/2013 | Akimoto et al. |
| 8,493,309 B2 | 7/2013 | Tobita |
| 8,520,159 B2 | 8/2013 | Umezaki et al. |
| 8,629,069 B2 | 1/2014 | Akimoto et al. |
| 8,669,550 B2 | 3/2014 | Akimoto et al. |
| 8,729,544 B2 | 5/2014 | Yamazaki et al. |
| 8,743,044 B2 | 6/2014 | Umezaki et al. |
| 8,774,347 B2 | 7/2014 | Umezaki |
| 8,790,959 B2 | 7/2014 | Akimoto et al. |
| 8,796,069 B2 | 8/2014 | Akimoto et al. |
| 8,816,949 B2 | 8/2014 | Tobita |
| 8,902,145 B2 | 12/2014 | Umezaki et al. |
| 8,908,115 B2 | 12/2014 | Umezaki et al. |
| 9,036,767 B2 | 5/2015 | Umezaki |
| 9,087,745 B2 | 7/2015 | Yamazaki et al. |
| 9,099,562 B2 | 8/2015 | Akimoto et al. |
| 9,111,804 B2 | 8/2015 | Yamazaki et al. |
| 9,153,341 B2 | 10/2015 | Umezaki |
| 9,311,876 B2 | 4/2016 | Umezaki |
| 9,318,053 B2 | 4/2016 | Umezaki et al. |
| 9,646,714 B2 | 5/2017 | Umezaki |
| 10,121,435 B2 | 11/2018 | Umezaki |
| 10,665,195 B2 | 5/2020 | Umezaki |
| 10,971,103 B2 | 4/2021 | Umezaki |
| 2001/0046027 A1 | 11/2001 | Tai et al. |
| 2002/0003964 A1 | 1/2002 | Kanbara et al. |
| 2002/0056838 A1 | 5/2002 | Ogawa |
| 2002/0132454 A1 | 9/2002 | Ohtsu et al. |
| 2002/0158666 A1 | 10/2002 | Azami et al. |
| 2003/0189401 A1 | 10/2003 | Kido et al. |
| 2003/0218222 A1 | 11/2003 | Wager, III et al. |
| 2003/0231735 A1 | 12/2003 | Moon et al. |
| 2004/0038446 A1 | 2/2004 | Takeda et al. |
| 2004/0127038 A1 | 7/2004 | Carcia et al. |
| 2004/0140839 A1 | 7/2004 | Nagao et al. |
| 2004/0165692 A1 | 8/2004 | Moon et al. |
| 2004/0217935 A1 | 11/2004 | Jeon et al. |
| 2004/0253781 A1 | 12/2004 | Kimura et al. |
| 2005/0008114 A1 * | 1/2005 | Moon ................... G09G 3/3677 377/64 |
| 2005/0017302 A1 | 1/2005 | Hoffman |
| 2005/0199959 A1 | 9/2005 | Chiang et al. |
| 2006/0001637 A1 | 1/2006 | Pak et al. |
| 2006/0035452 A1 | 2/2006 | Carcia et al. |
| 2006/0043377 A1 | 3/2006 | Hoffman et al. |
| 2006/0091466 A1 | 5/2006 | Sugimae et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |

(56) References Cited

U.S. PATENT DOCUMENTS

| | | |
|---|---|---|
| 2006/0244107 A1 | 11/2006 | Sugihara et al. |
| 2006/0280279 A1 | 12/2006 | Nagao et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0024539 A1 | 2/2007 | Chung |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0247932 A1 | 10/2007 | Tobita |
| 2007/0252928 A1 | 11/2007 | Ito et al. |
| 2007/0272922 A1 | 11/2007 | Kim et al. |
| 2007/0274433 A1 | 11/2007 | Tobita |
| 2007/0287296 A1 | 12/2007 | Chang |
| 2008/0006877 A1 | 1/2008 | Mardilovich et al. |
| 2008/0007296 A1 | 1/2008 | Umezaki |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0079001 A1 | 4/2008 | Umezaki et al. |
| 2008/0079685 A1* | 4/2008 | Umezaki ............... G11C 19/28 345/100 |
| 2008/0080661 A1 | 4/2008 | Tobita |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308805 A1 | 12/2008 | Akimoto et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0166616 A1 | 7/2009 | Uchiyama |
| 2009/0251443 A1 | 10/2009 | Jinta |
| 2009/0278122 A1 | 11/2009 | Hosono et al. |
| 2009/0280600 A1 | 11/2009 | Hosono et al. |
| 2009/0294847 A1 | 12/2009 | Mori |
| 2009/0304138 A1 | 12/2009 | Tsai et al. |
| 2009/0305461 A1 | 12/2009 | Akimoto et al. |
| 2009/0310734 A1* | 12/2009 | Umezaki ............... G09G 3/3648 377/64 |
| 2010/0007635 A1 | 1/2010 | Kwon et al. |
| 2010/0060561 A1 | 3/2010 | Deane |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0226473 A1 | 9/2010 | Liu et al. |
| 2010/0245300 A1* | 9/2010 | Chan ............... G09G 3/3677 345/204 |
| 2010/0260312 A1 | 10/2010 | Tsai et al. |
| 2010/0276689 A1 | 11/2010 | Iwasaki |
| 2010/0279462 A1 | 11/2010 | Iwasaki |
| 2010/0316182 A1 | 12/2010 | Lai |
| 2011/0044423 A1 | 2/2011 | Lin et al. |
| 2011/0058640 A1* | 3/2011 | Shang ............... G11C 19/184 377/64 |
| 2011/0095288 A1 | 4/2011 | Morosawa et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0193832 A1 | 8/2011 | Hirabayashi |
| 2011/0234565 A1 | 9/2011 | Morii et al. |
| 2012/0098804 A1 | 4/2012 | Ohhashi |
| 2012/0236221 A1 | 9/2012 | Kimura |
| 2013/0272487 A1 | 10/2013 | Tobita |
| 2014/0175437 A1 | 6/2014 | Uchiyama |
| 2015/0077676 A1 | 3/2015 | Umezaki et al. |
| 2015/0137118 A1 | 5/2015 | Umezaki et al. |
| 2015/0340513 A1 | 11/2015 | Akimoto et al. |
| 2015/0349099 A1 | 12/2015 | Yamazaki et al. |
| 2017/0323957 A1 | 11/2017 | Yamazaki et al. |
| 2021/0193072 A1 | 6/2021 | Umezaki |

FOREIGN PATENT DOCUMENTS

| | | |
|---|---|---|
| CN | 101075409 A | 11/2007 |
| CN | 101335293 A | 12/2008 |
| CN | 101777386 A | 7/2010 |
| EP | 1450342 A | 8/2004 |
| EP | 1737044 A | 12/2006 |
| EP | 1770788 A | 4/2007 |
| EP | 1870877 A | 12/2007 |
| EP | 1906414 A | 4/2008 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| EP | 2447950 A | 5/2012 |
| JP | 60-198861 A | 10/1985 |
| JP | 61-081229 | 5/1986 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-052494 A | 2/2001 |
| JP | 2001-101889 A | 4/2001 |
| JP | 2001-176288 A | 6/2001 |
| JP | 2002-076356 A | 3/2002 |
| JP | 2002-289859 A | 10/2002 |
| JP | 2003-016794 A | 1/2003 |
| JP | 2003-058097 A | 2/2003 |
| JP | 2003-086000 A | 3/2003 |
| JP | 2003-086808 A | 3/2003 |
| JP | 2004-078172 A | 3/2004 |
| JP | 2004-103957 A | 4/2004 |
| JP | 2004-222256 A | 8/2004 |
| JP | 2004-226429 A | 8/2004 |
| JP | 2004-273614 A | 9/2004 |
| JP | 2004-273732 A | 9/2004 |
| JP | 2004-295126 A | 10/2004 |
| JP | 2005-050502 A | 2/2005 |
| JP | 2006-228312 A | 8/2006 |
| JP | 2007-103918 A | 4/2007 |
| JP | 2007-123861 A | 5/2007 |
| JP | 2007-151092 A | 6/2007 |
| JP | 2007-207413 A | 8/2007 |
| JP | 2007-293995 A | 11/2007 |
| JP | 2007-317288 A | 12/2007 |
| JP | 2007-317344 A | 12/2007 |
| JP | 2008-003602 A | 1/2008 |
| JP | 2008-009393 A | 1/2008 |
| JP | 2008-107807 A | 5/2008 |
| JP | 2008-537626 | 9/2008 |
| JP | 2009-092982 A | 4/2009 |

(56) References Cited

FOREIGN PATENT DOCUMENTS

| | | |
|---|---|---|
| JP | 2009-260378 A | 11/2009 |
| JP | 2010-016163 A | 1/2010 |
| JP | 2010-020279 A | 1/2010 |
| JP | 2010-021899 A | 1/2010 |
| JP | 2010-027194 A | 2/2010 |
| KR | 2007-0004437 A | 1/2007 |
| KR | 10-0857479 | 9/2008 |
| KR | 2008-0103572 A | 11/2008 |
| KR | 2009-0071358 A | 7/2009 |
| KR | 2010-0014164 A | 2/2010 |
| KR | 2010-0085331 A | 7/2010 |
| TW | 200502891 | 1/2005 |
| TW | 200836150 | 9/2008 |
| WO | WO-2003/107314 | 12/2003 |
| WO | WO-2004/114391 | 12/2004 |
| WO | WO-2006/100637 | 9/2006 |
| WO | WO-2007/029844 | 3/2007 |
| WO | WO-2007/108293 | 9/2007 |
| WO | WO-2010/067643 | 6/2010 |
| WO | WO-2010/150574 | 12/2010 |

OTHER PUBLICATIONS

Written Opinion (Application No. PCT/JP2011/052078) dated Apr. 12, 2011.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Fung.T et al., "2-D Numerical Simulation of High Performance Amorphous In—Ga—Zn-O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1 Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YbFe2O4, and Yb2Fe3O7 Types of Structures for Compounds in the In2O3 and Sc2O3-A2O3—BO Systems [A; Fe, Ga, or Al; B: Mg, Mn, Fe, Ni, Cu,or Zn] at Temperatures Over 1000° C", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.

(56) References Cited

OTHER PUBLICATIONS

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of Zno Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 IN. QVGA AMOLED Display Using In—Ga—Zn—Oxide TFTS With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
PARK.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1 -262106-3.
Park.S et al., "Challenge to Future Displays: Transparent AM-OLED Driven by Peald Grown ZnO TFT", IMID '07 Digest, 2007, pp. 1249-1252.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-IN. AMOLED Display With Driver Circuit Using Amorphous In—Ga—Zn-Oxide TFTS", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Chinese Office Action (Application No. 201180010742.7) dated Oct. 14, 2014.
Taiwanese Office Action (Application No. 100104416) dated Sep. 9, 2015.
Taiwanese Office Action (Application No. 106111745) dated Jul. 5, 2017.
Korean Office Action (Application No. 2017-7023378) dated Sep. 12, 2017.
Korean Office Action (Application No. 2018-7030625) dated Oct. 31, 2018.

* cited by examiner

DISPLAY DEVICE, SEMICONDUCTOR DEVICE, AND DRIVING METHOD THEREOF

CROSS-REFERENCE TO RELATED APPLICATIONS

This application is a continuation of U.S. application Ser. No. 15/680,348, filed Aug. 18, 2017, which is a continuation of U.S. application Ser. No. 14/885,353, filed Oct. 16, 2015, now abandoned, which is a divisional of U.S. application Ser. No. 14/085,864, filed Nov. 21, 2013, now abandoned, which is a continuation of U.S. application Ser. No. 13/025,479, filed Feb. 11, 2011, now U.S. Pat. No. 8,599,998, which claims the benefit of a foreign priority application filed in Japan as Serial No. 2010-036902 on Feb. 23, 2010, all of which are incorporated by reference.

TECHNICAL FIELD

One embodiment of the present invention relates to display devices. For example, one embodiment of the present invention relates to liquid crystal display devices. One of the technical fields relates to a display device in which an image is displayed when a pixel is selected by a gate signal line and a source signal line. Further, one of the technical fields relates to an electronic appliance with a display device and a semiconductor device such as a driver circuit used in a display device.

BACKGROUND ART

Gate driver circuits including amorphous silicon transistors (also referred to as a-Si TFTs) have been developed (see Patent Documents 1 and 2, for example). Such a gate driver includes a transistor for controlling the timing of outputting a high voltage to a gate line (such a transistor is also referred to as a pull up transistor). The pull up transistor has a source and a drain one of which is connected to a clock line and the other of which is connected to a gate line. In addition, such a gate driver employs a driving method in which the potential of a gate of the pull up transistor is made higher than the high (H-level) potential of a clock signal by capacitive coupling. In order to achieve this driving method, it is necessary to make the gate of the pull up transistor be floating. It is therefore necessary to turn off all the transistors that are connected to the gate of the pull up transistor.

REFERENCE

[Reference 1] Japanese Published Patent Application No. 2007-207413
[Reference 2] Japanese Published Patent Application No. 2008-009393

DISCLOSURE OF INVENTION

In conventional techniques, however, even when all the transistors that are connected to a gate of a pull up transistor are turned off, electrical charge stored in the gate of the pull up transistor is lost as time passes because of the off-state current of the transistor. It is therefore difficult to lower the drive frequency of a semiconductor device such as a gate driver circuit. Further, the range of the drive frequency at which the semiconductor device can operate is narrow. Consequently, there is a limit to improvement in the drive capability of the semiconductor device.

In view of the problems, an object of one embodiment of the present invention is to improve operation of a semiconductor device including a transistor (a pull-up transistor) that controls the timing of when a predetermined voltage is outputted to a circuit located at the subsequent stage. An object of one embodiment of the present invention is to improve the drive capability of a semiconductor device including a transistor (a pull-up transistor) that controls the timing of when a predetermined voltage is outputted to a circuit located at the subsequent stage.

One embodiment of the present invention is a semiconductor device including a first transistor, and a second transistor electrically connected to a gate of the first transistor. A first terminal of the first transistor is electrically connected to a first line. A second terminal of the first transistor is electrically connected to a second line. The gate of the first transistor is electrically connected to a first terminal or a second terminal of the second transistor. In the semiconductor device, the first transistor and the second transistor can have an oxide semiconductor at least in their channel regions and have a low off-state current. Alternatively, at least the second transistor can have an oxide semiconductor at least in its channel region and have a low off-state current. Specifically, the first transistor or the second transistor can have an off-state current of 1 aA/$\mu$m or less per 1 $\mu$m of channel width at room temperature (20° C. in this case). One or more of the second transistors can be provided in the semiconductor device. It is preferable that when a plurality of the second transistors is provided, all these transistors have an oxide semiconductor at least in their channel regions and have a low off-state current. In the semiconductor device, the second line can be electrically connected to a circuit located at the subsequent stage. Thus, the first transistor can serve as a transistor (a pull-up transistor) that controls the timing of when a predetermined voltage is outputted to the circuit located at the subsequent stage.

One embodiment of the present invention is a semiconductor device including a first transistor; a second transistor; and a third transistor. A first terminal of the first transistor is electrically connected to a first line, and a second terminal of the first transistor is electrically connected to a second line. A first terminal of the second transistor is electrically connected to the second line; a second terminal of the second transistor is electrically connected to a gate of the first transistor; and a gate of the second transistor is electrically connected to the first line. A first terminal of the third transistor is electrically connected to a third line; a second terminal of the third transistor is electrically connected to the gate of the first transistor; and a gate of the third transistor is electrically connected to the third line. At least a channel region of the first to third transistors can be formed using an oxide semiconductor. Off-state current of the first to third transistors can be 1 aA/$\mu$m or less. Alternatively, at least a channel region of at least the second and third transistors can be formed using an oxide semiconductor. Off-state current of at least the second and third transistors can be 1 aA/$\mu$m or less.

One embodiment of the present invention is a semiconductor device including a first transistor; a second transistor; and a third transistor. A first terminal of the first transistor is electrically connected to a first line, and a second terminal of the first transistor is electrically connected to a second line. A first terminal of the second transistor is electrically connected to a third line; a second terminal of the second transistor is electrically connected to a fourth line. A first terminal of the third transistor is electrically connected to the third line; a second terminal of the third transistor is electrically connected to the gate of the first transistor; and a gate of the third transistor is electrically connected to the fourth line. At least a channel region of the first to third transistors can be formed using an oxide semiconductor. Off-state current of the first to third transistors can be 1 aA/μm or less. Alternatively, at least a channel region of at least the third transistor can be formed using an oxide semiconductor. Off-state current of at least the third transistor can be 1 aA/μm or less.

One embodiment of the present invention is a semiconductor device including a first transistor; a second transistor; a third transistor; and a fourth transistor. A first terminal of the first transistor is electrically connected to a first line, and a second terminal of the first transistor is electrically connected to a second line. A first terminal of the second transistor is electrically connected to a third line; a second terminal of the second transistor is electrically connected to a gate of the first transistor; and a gate of the second transistor is electrically connected to the first line. A first terminal of the third transistor is electrically connected to the third line; a second terminal of the third transistor is electrically connected to the gate of the first transistor; and a gate of the third transistor is electrically connected to the gate of the second transistor. A first terminal of the fourth transistor is electrically connected to a fourth line; a second terminal of the fourth transistor is electrically connected to the gate of the first transistor; and a gate of the fourth transistor is electrically connected to the fourth line. At least a channel region of the first to fourth transistors can be formed using an oxide semiconductor. Off-state current of the first to fourth transistors can be 1 aA/μm or less. Alternatively, at least a channel region of at least the second to fourth transistors can be formed using an oxide semiconductor. Off-state current of at least the second to fourth transistors can be 1 aA/μm or less.

One embodiment of the present invention is a semiconductor device including a first transistor; a second transistor; a third transistor; and a fourth transistor. A first terminal of the first transistor is electrically connected to a first line, and a second terminal of the first transistor is electrically connected to a second line. A first terminal of the second transistor is electrically connected to a third line; a second terminal of the second transistor is electrically connected to a gate of the first transistor; and a gate of the second transistor is electrically connected to the first line. A first terminal of the third transistor is electrically connected to a fourth line; a second terminal of the third transistor is electrically connected to the gate of the first transistor; and a gate of the third transistor is electrically connected to the fourth line. A first terminal of the fourth transistor is electrically connected to the third line; a second terminal of the fourth transistor is electrically connected to the gate of the first transistor; and a gate of the fourth transistor is electrically connected to a fifth line. At least a channel region of the first to fourth transistors can be formed using an oxide semiconductor. Off-state current of the first to fourth transistors can be 1 aA/μm or less. Alternatively, at least a channel region of at least the second to fourth transistors can be formed using an oxide semiconductor. Off-state current of at least the second to fourth transistors can be 1 aA/μm or less.

Another embodiment of the present invention is a display device including a gate driver circuit and using the above semiconductor device as the gate driver circuit.

In this specification, the explicit description "X and Y are connected to each other" may mean that X and Y are electrically connected to each other. Here, X and Y each denote an object (e.g., a device, an element, a circuit, a line, an electrode, a terminal, a conductive film, a layer, or the like). An example of the case where X and Y are electrically connected to each other is a case where one or more elements that enable electrical connection between X and Y (e.g., a switch, a transistor, a capacitor, an inductor, a resistor, and a diode) are connected between X and Y.

One embodiment of the present invention is a semiconductor device including a transistor (a pull-up transistor) that controls the timing of when a high voltage is outputted to a circuit located at the subsequent stage. In this semiconductor device, charge stored in a gate of the pull-up transistor is held for a long period of time. Therefore, it is possible to reduce the drive frequency of the semiconductor device and to widen the range of the drive frequency at which the semiconductor device can operate. Thus, the operation of the semiconductor device can be improved. Alternatively, the drive capability of the semiconductor device can be improved.

BEST MODE FOR CARRYING OUT THE INVENTION

Figure 1A:
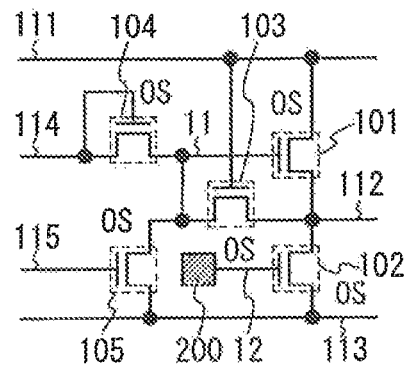
FIGS. 1A to 1F are diagrams showing configurations of circuits of Embodiment 1.

Embodiments will be described below with reference to the drawings. Note that the embodiments can be implemented in various different ways. It will be readily appreciated by those skilled in the art that modes and details of the embodiments can be changed in various ways without departing from the spirit and scope of the present invention. Therefore, the present invention should not be construed as being limited to the description of the embodiments. Note that in structures described below, the same portions or portions having similar functions are denoted by common reference numerals in different drawings, and detailed description thereof is not repeated. In the reference drawings, the size, the thickness of layers, or regions is exaggerated for clarity in some cases. Therefore, the embodiments of the present invention are not limited to such scales.

Embodiment 1

In this embodiment, a circuit in a display device that is one embodiment of the present invention will be described.

FIG. 1A shows an example of the configuration of a circuit including a transistor 101, a transistor 102, a transistor 103, a transistor 104, a transistor 105, and a circuit 200. The transistors included in the circuit shown in FIG. 1A are n-channel transistors. An n-channel transistor is turned on when a potential difference between a gate and a source is higher than the threshold voltage.

Note that the transistors included in the circuit shown in FIG. 1A can each have a semiconductor layer of an oxide semiconductor that is intrinsic (i-type) or substantially intrinsic, has an adequately lowered hydrogen concentration which makes the oxide semiconductor highly purified, and has an adequately low carrier concentration. This leads to improvement in the subthreshold swing of the transistor, a reduction in the off-state current of the transistor, improvement in the withstand voltage of the transistor, and improvement in the temperature characteristics of the transistor.

It is acceptable that one or some transistors have semiconductor layers of the oxide semiconductor, and the other transistors have semiconductor layers of a semiconductor different from the oxide semiconductor (for example, silicon (e.g., amorphous silicon, microcrystalline silicon, or polycrystalline silicon), an organic semiconductor, or the like). Note that at least a transistor to which a source or a drain of the transistor 101 is electrically connected has a semiconductor layer of the oxide semiconductor.

Next, connections in the circuit shown in FIG. 1A will be described. A first terminal (one of a source and a drain) of the transistor 101 is connected to a line 111, and a second terminal (the other of the source and the drain) of the transistor 101 is connected to a line 112. A first terminal of the transistor 102 is connected to a line 113; a second terminal of the transistor 102 is connected to the line 112; and a gate of the transistor 102 is connected to the circuit 200. A first terminal of the transistor 103 is connected to the line 112; a second terminal of the transistor 103 is connected to the gate of the transistor 101; and a gate of the transistor 103 is connected to the line 111. A first terminal of the transistor 104 is connected to a line 114; a second terminal of the transistor 104 is connected to the gate of the transistor 101; and a gate of the transistor 104 is connected to the line 114. A first terminal of the transistor 105 is connected to the line 113; a second terminal of the transistor 105 is connected to the gate of the transistor 101; and a gate of the transistor 105 is connected to a line 115. Note that a node 11 represents a connection point of the gate of the transistor 101; the second terminal of the transistor 103; the second terminal of the transistor 104; and the second terminal of the transistor 105. A node 12 represents a connection point of the gate of the transistor 102 and the circuit 200.

Figure 1B:
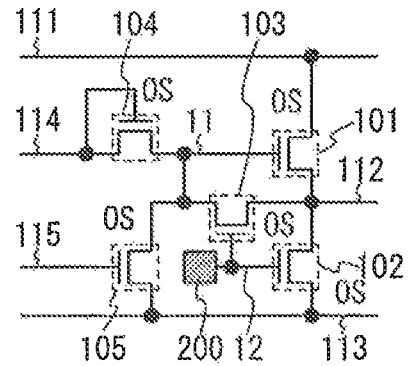
Figure 1C:
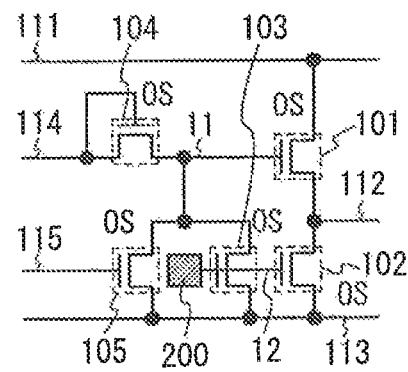
Figure 1D:
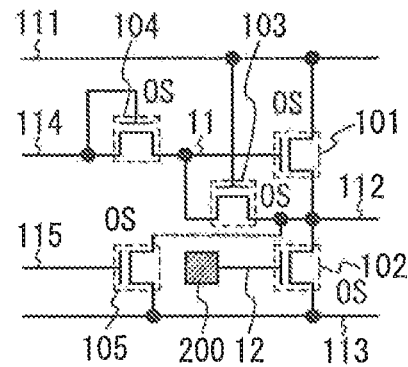
Figure 1E:
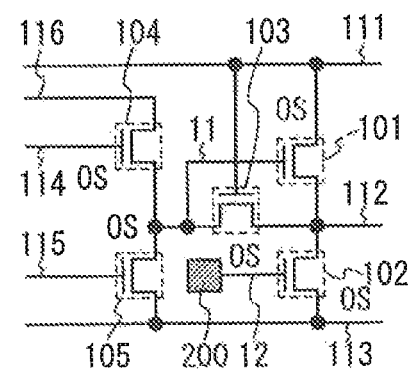
Figure 1F:
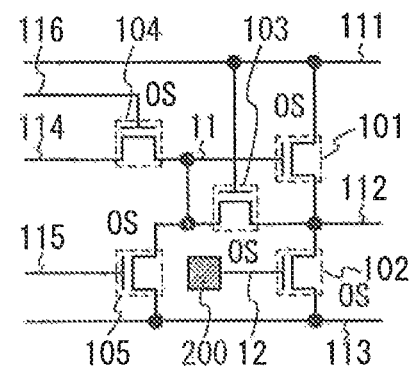

Note that the configuration of a circuit relating to a display device that is one embodiment of the present invention is not limited to the configuration of the circuit shown in FIG. 1A. For example, as shown in FIG. 1B, the gate of the transistor 103 can be connected to the gate of the transistor 102. As another example, as shown in FIG. 1C, the first terminal of the transistor 103 can be connected to the line 113 and the gate of the transistor 103 can be connected to the gate of the transistor 102. As another example, as shown in FIG. 1D, the second terminal of the transistor 105 can be connected to the line 112. As another example, as shown in FIG. 1E, the first terminal of the transistor 104 can be connected to a line 116. As another example, as shown in FIG. 1F, the gate of the transistor 104 can be connected to the line 116. Note that at least two or more of the configurations shown in FIG. 1B to 1F can be combined with each other. For example, when the configuration shown in FIG. 1C and the configuration shown in FIG. 1E are combined with each other, the first terminal of the transistor 103 can be connected to the line 113 and the first terminal of the transistor 104 can be connected to the line 116.

Note that the circuit 200 can be connected to a predetermined line or node depending on its structure. For example, the circuit 200 can be connected to at least one of the line 111, the line 112, the line 113, the line 114, and the node 11.

A clock signal is inputted to the line 111. An output signal of the circuit of this embodiment is inputted to the line 112. Potential $V_2$ is applied to the line 113. A start pulse is inputted to the line 114. A reset signal is inputted to the line 115. Here, the potential of the H-level signal inputted to the line 111, the line 112, the line 114, and the line 115 is referred to as potential V1 for convenience, while the potential of the L-level signal inputted to the line 111, the line 112, the line 114, and the line 115 is referred to as the potential $V_2$ for convenience.

The line 111 is used for transmitting a signal such as a clock signal from an external circuit such as a controller to the circuit of this embodiment. The line 111 functions as a signal line or a clock line. The line 112 is used for transmitting an output signal of the circuit of this embodiment to a circuit such as a pixel circuit or a demultiplexer. The line 112 functions as a signal line or a gate line. The line 113 is used for supplying a power supply voltage such as the potential V2 from an external circuit such as a power supply circuit to the circuit of this embodiment. The line 113 functions as a power supply line, a negative supply line, or a ground line. The line 114 is used for transmitting a start signal from another circuit or an external circuit such as a timing controller to the circuit of this embodiment. The line 114 functions as a signal line. The line 115 is used for transmitting a reset signal from another circuit or an external circuit such as a timing controller to the circuit of this embodiment. The line 115 functions as a signal line.

The transistor 101 functions as a switch for controlling continuity between the line 111 and the line 112. Further, the transistor 101 has a function of controlling the timing of raising the potential of the node 11 by capacitive coupling between the second terminal and the gate of the transistor 101. The transistor 102 functions as a switch for controlling continuity between the line 113 and the line 112. The transistor 103 functions as a switch for controlling continuity between the line 112 and the node 11. The transistor 104 functions as a switch for controlling continuity between the line 114 and the node 11. Further, the transistor 104 functions as a diode whose input terminal is connected to the line 114 and whose output terminal is connected to the node 11. The transistor 105 functions as a switch for controlling continuity between the line 113 and the node 11.

Next, an example of the operation of the circuits in FIGS. 1A to 1F will be described with reference to a timing diagram of FIG. 2A and schematic diagrams of FIGS. 2B to 2E and FIGS. 3A to 3C. Here, the circuit in FIG. 1A will be described as an example.

Figure 2A:
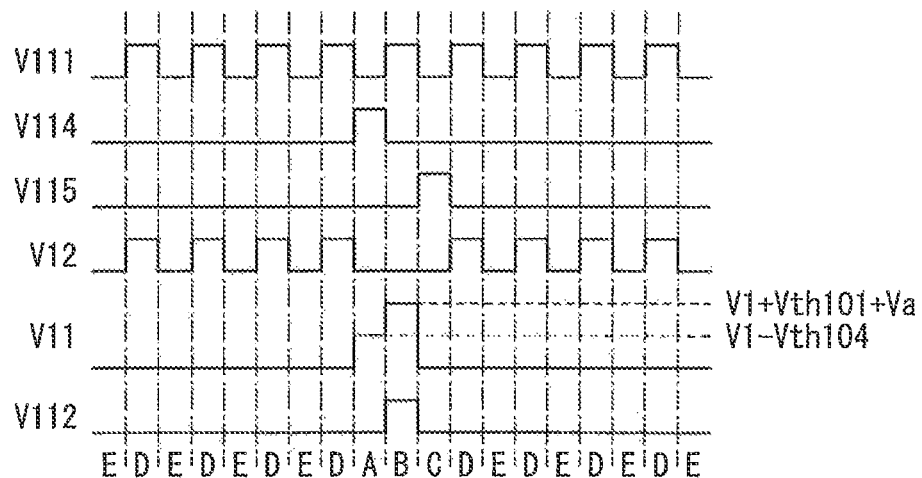
FIG. 2A is a timing diagram for describing the operation of the circuit of Embodiment 1.

FIG. 2A is an example of a timing diagram showing the potential of the line 111, the line 114, the line 115, the line 112, the node 11, and the node 12. The timing diagram of FIG. 2A includes a period A, a period B, a period C, a period D, and a period E. The timing diagram of FIG. 2A includes a period in which the period A, the period B, and the period C appear in order; and a period in which the period D and the period E appear alternately.

Figure 2B:
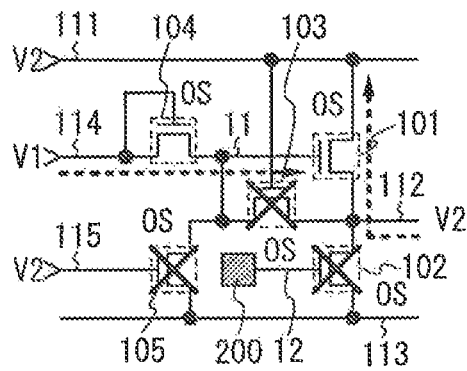
FIGS. 2B to 2E are schematic views for describing the operation of the circuit of Embodiment 1.
Figure 2C:
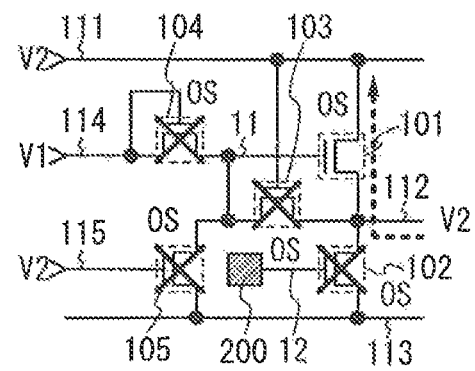

First, the period A will be described with reference to FIGS. 2A to 2C. In the period A, the potential of the line 111 (referred to as potential V111) becomes V2 (low potential). Consequently, the transistor 103 is turned off, so that continuity between the line 112 and the node 11 is broken. The potential of the line 114 (referred to as potential V114) becomes V1 (high potential). Consequently, the transistor 104 is turned on, so that continuity between the line 114 and the node 11 is established. The potential of the line 115 (referred to as potential V115) becomes V2. Consequently, the transistor 105 is turned off, so that continuity between the line 113 and the node 11 is broken. Thus, the potential of the line 114 is applied to the node 11, so that the potential of the node 11 (referred to as potential V11) starts to increase. Then, the potential of the node 11 exceeds V2+Vth101 (Vth101 is the threshold voltage of the transistor 101). The transistor 101 is therefore turned on, so that continuity between the line 112 and the line 111 is established. The potential of the node 12 (referred to as potential V12) becomes V2 or at least less than V2+Vth102 (Vth102 is the threshold voltage of the transistor 102) because of the circuit 200. Thus, the transistor 102 is turned off, so that continuity between the line 113 and the line 112 is broken. Consequently, the potential of the line 111 is applied to the line 112, so that the potential of the line 112 (referred to as potential V112) becomes V2 (see FIG. 2B).

After that, the potential of the node 11 further increases. Then, the potential of the node 11 increases to V1−Vth104 (Vth104 is the threshold voltage of the transistor 104). Thus, the transistor 104 is turned off, so that continuity between the line 114 and the node 11 is broken. The node 11 becomes therefore floating, so that the potential of the node 11 is maintained at V1−Vth104 (see FIG. 2C).

Figure 2D:
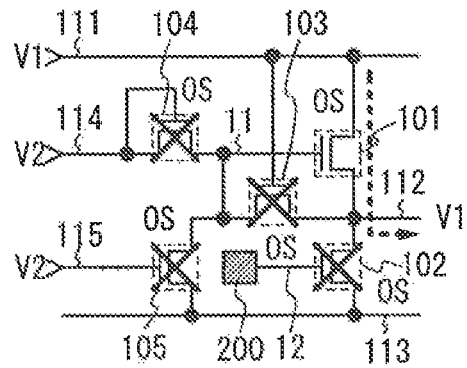

The period B will be described with reference to FIGS. 2A and 2D. In the period B, the potential of the node 12 remains to be V2 or less than V2+Vth102 because of the circuit 200. Consequently, the transistor 102 remains off, so that continuity between the line 113 and the line 112 remains broken. The potential of the line 111 becomes V1. Thus, the transistor 101 remains on, and the potential of the line 112 increases. The transistor 103 is turned on at the same time, so that continuity between the line 112 and the node 11 is established. Note that the transistor 103 is turned off when the potential of the line 112 reaches V1−Vth103 (Vth103 is the threshold voltage of the transistor 103). Continuity between the line 112 and the node 11 is therefore broken. The potential of the line 114 becomes V2. Consequently, the transistor 104 remains off, so that continuity between the line 114 and the node 11 remains broken. The potential of the line 115 remains to be V2. Thus, the transistor 105 remains off, so that continuity between the line 113 and the node 11 remains broken. The node 11 becomes therefore floating. The potential of the line 112 keeps increasing here. Consequently, the potential of the node 11 can increase to V1+Vth101+Va (Va is a positive number) because of parasitic capacitance between the gate and the second terminal of the transistor 101. This is so-called bootstrap operation. Thus, the potential of the line 112 can increase to the potential V1 (see FIG. 2D).

Figure 2E:
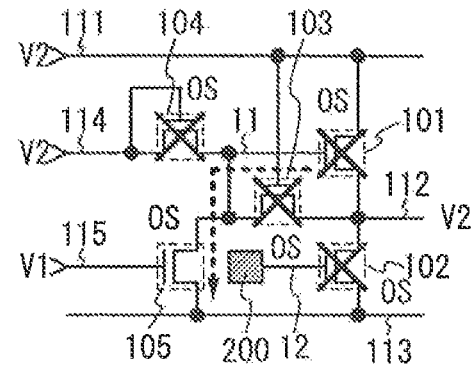
Figure 3A:
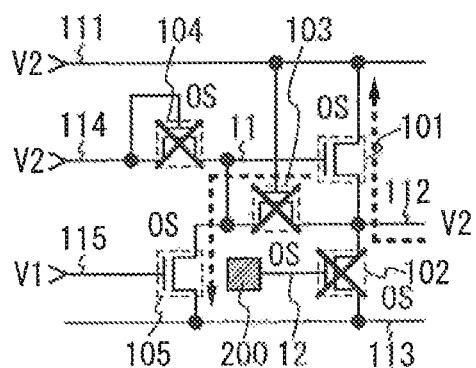
FIGS. 3A to 3C are schematic views for describing the operation of the circuit of Embodiment 1.

The period C will be described with reference to FIGS. 2A and 2E and FIG. 3A. In the period C, the potential of the line 111 becomes V2. Consequently, the transistor 103 remains off, so that continuity between the line 112 and the node 11 remains broken. The potential of the line 114 remains to be V2. Thus, the transistor 104 remains off, so that continuity between the line 114 and the node 11 remains established. The potential of the line 115 becomes V1. Consequently, the transistor 105 is turned on, so that continuity between the line 113 and the node 11 is established. The potential of the line 113 is therefore applied to the node 11. Since the potential of the line 113 is V2, the potential of the node 11 becomes V2. Thus, the transistor 101 is turned off, so that continuity between the line 111 and the line 112 is broken. The potential of the node 12 remains less than V2+Vth102 because of the circuit 200. Consequently, the transistor 102 remains off, so that continuity between the line 113 and the line 112 remains broken (see FIG. 2E). Note that in many cases, the timing of when the potential of the line 111 becomes V2 comes earlier than the timing of when the transistor 101 is turned off. For this reason, the potential of the line 111 is applied to the line 112 before the transistor 101 is turned off, so that the potential of the line 112 becomes V2 (see FIG. 3A).

Figure 3B:
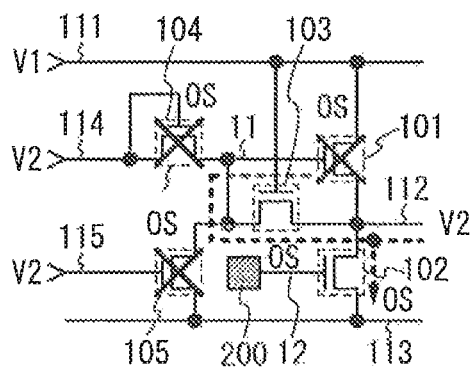

The period D will be described with reference to FIG. 2A and FIG. 3B. In the period D, the potential of the line 111 becomes V1. Consequently, the transistor 103 is turned on, so that continuity between the line 112 and the node 11 is established. The potential of the line 114 remains to be V2. Thus, the transistor 104 remains off, so that continuity between the line 114 and the node 11 remains broken. The potential of the line 115 becomes V2. Consequently, continuity between the line 113 and the node 11 is broken. The potential of the node 12 exceeds V2+Vth102 because of the circuit 200. Thus, the transistor 102 is turned on, so that continuity between the line 113 and the line 112 is established. The potential of the line 113 is therefore applied to the node 11, so that the potential of the node 11 becomes V2. Thus, the transistor 101 is turned off, so that continuity between the line 111 and the line 112 is broken. The potential of the line 113 is applied to the line 112, so that the potential of the line 112 becomes V2 (see FIG. 3B).

Figure 3C:
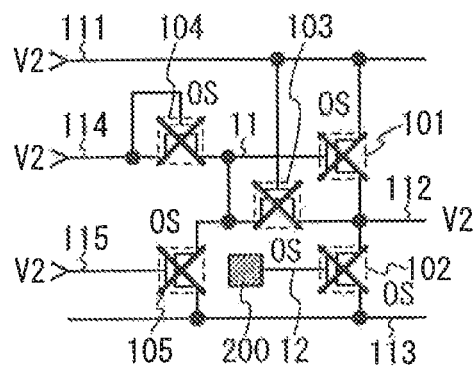

The period E will be described with reference to FIG. 2A and FIG. 3C. In the period E, the potential of the line 111 becomes V2. Consequently, the transistor 103 is turned off, so that continuity between the line 112 and the node 11 is broken. The potential of the line 114 remains to be V2. Thus, the transistor 104 remains off, so that continuity between the line 114 and the node 11 remains broken. The potential of the line 115 remains to be V2. Consequently, continuity between the line 113 and the node 11 is broken. The potential of the node 12 becomes V2 or less than V2+Vth102 because of the circuit 200. Thus, the transistor 102 is turned off, so that continuity between the line 113 and the line 112 is broken. The node 11 becomes therefore floating, so that the potential of the node 11 remains to be V2. Thus, the transistor 101 remains off, so that continuity between the line 111 and the line 112 remains broken. The line 112 becomes floating, so that the potential of the line 112 remains to be V2 (see FIG. 3C).

Note that for the semiconductor device shown in FIG. 1C, in the period D, the potential of the node 12 preferably exceeds V2+Vth102 and also V2+Vth103. In this case, the transistor 103 is turned on, so that continuity between the line 113 and the node 11 is established. Consequently, the potential of the line 113 is applied to the node 11. Thus, the potential of the line 113 is applied to the node 11 through a single transistor, so that the potential of the node 11 can be stabilized.

Note that for the circuit shown in FIG. 1D, in the period C, continuity between the line 113 and the line 112 is established when the transistor 105 is turned on. Consequently, the potential of the line 113 is applied to the line 112. Thus, the fall time of V112 can be shortened.

Note that for the circuit shown in FIG. 1E, the potential of the line 116 is preferably V2 in the period A. In the periods B to E, the potential of the line 116 can be either V1 or V2. The voltage V1 can therefore be applied to the line 116. Alternatively, a clock signal that is out of phase with the clock signal inputted to the line 111 can be inputted to the line 116. Alternatively, for example, a signal obtained by inverting the clock signal inputted to the line 111 can be inputted to the line 116. For the semiconductor device shown in FIG. 1F, the potential of the line 116 preferably becomes V1 in the period A, and V2 in the period B. In the periods C to E, the potential of the line 116 can be either V1 or V2. A clock signal that is out of phase with the clock signal inputted to the line 111 can be inputted to the line 116. Alternatively, a signal obtained by inverting the clock signal inputted to the line 111 can be inputted to the line 116.

As described above, in the above-described semiconductor devices, the potential of the line 112 can be made equal to the potential of the line 111 by using the bootstrap operation.

Note that in conventional techniques, the transistors have a high subthreshold swing. This causes any of the following problems: the time from when the potential of the line 114 becomes V1 until when the transistor 104 is turned off is long; it is difficult to increase drive frequency because it is necessary to extend the period A; the rise time of V112 is long (the rise time of the output signal is long); a load that can be applied to the line 112 is light; the channel width of the transistor 101 is large; and the layout area is large.

In contrast, in this embodiment, the transistors have a low subthreshold swing. Drive capability can therefore be improved. For example, when the subthreshold swing of the transistor 104 is low, it is possible to shorten the time from when the potential of the line 114 is V1 until when the transistor 104 is turned on. Consequently, the length of the period A can be shortened, leading to improvement in drive frequency. As another example, when the subthreshold swing of the transistor 104 is low, it is possible to shorten the rise time of V112. Alternatively, even when a heavy load is applied to the line 112, the load can be driven. Alternatively, the channel width of the transistor 101 can be reduced, leading to a reduction in layout area.

Note that in conventional techniques, the transistors have a high off-state current. This causes any of the following problems: the amount of electrical charge lost from the node 11 as time passes is large; the potential of the node 11 is decreased; the time during which the potential of the node 11 can be kept higher than a value at which the transistor 101 is turned on is short; it is difficult to lower drive frequency; and the range of the drive frequency at which the semiconductor device can operate is narrowed.

In contrast, in this embodiment, the transistors have a low off-state current. Drive capability can therefore be improved. For example, when the off-state current of the transistor 103, the transistor 104, and the transistor 105 is low, the amount of electrical charge lost from the node 11 can be decreased. Consequently, a reduction in the potential of the node 11 can be suppressed. That is, the time during which the potential of the node 11 can be kept higher than a value at which the transistor 101 is turned on can be extended. As a result, the drive frequency can be lowered; thus, the range of the drive frequency at which the semiconductor device can operate can be widened.

The circuits shown in FIGS. 1A to 1F can additionally include an element such as a transistor. An example will be described.

Figure 4A:
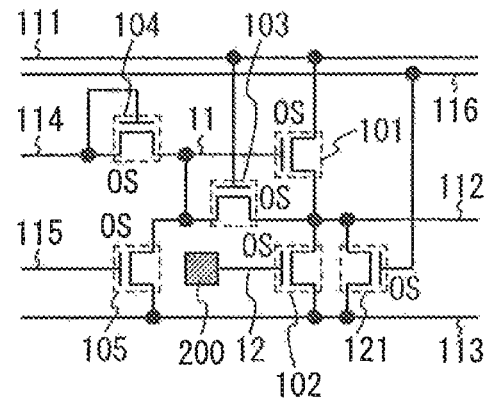
FIGS. 4A to 4F are diagrams showing configurations of circuits of Embodiment 1.

FIG. 4A shows an example of the circuit shown in FIG. 1A including a transistor 121. The circuits shown in FIGS. 1B to 1F can include the transistor 121 in the same way. A first terminal of the transistor 121 is connected to the line 113. A second terminal of the transistor 121 is connected to the line 112. A gate of the transistor 121 is connected to the line 116. A clock signal is preferably inputted to the line 116. Thus, in the period E, the transistor 121 is turned on, so that the potential of the line 113 is applied to the line 112. Consequently, noise in the line 112 can be reduced.

Figure 4B:
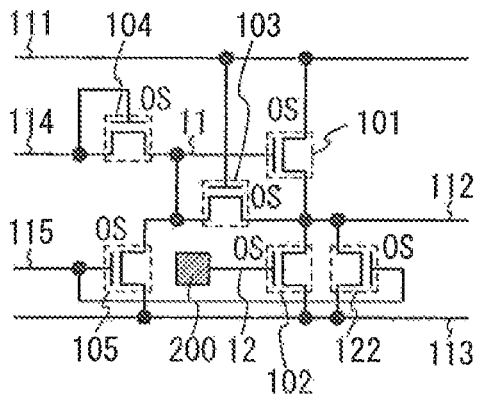

FIG. 4B shows an example of the circuit shown in FIG. 1A including a transistor 122. The circuits shown in FIGS. 1B to 1F and FIG. 4A can include the transistor 122 in the same way. A first terminal of the transistor 122 is connected to the line 113. A second terminal of the transistor 122 is connected to the line 112. A gate of the transistor 122 is connected to the line 115. Thus, in the period C, the transistor 122 is turned on, allowing the potential of the line 113 to be applied to the line 112. Consequently, the rise time of V112 can be shortened.

Figure 4C:
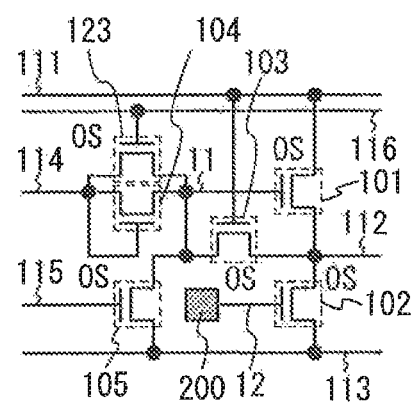

FIG. 4C shows an example of the circuit shown in FIG. 1A including a transistor 123. The circuits shown in FIGS. 1B to 1F and FIGS. 4A and 4B can include the transistor 123 in the same way. A first terminal of the transistor 123 is connected to the line 114. A second terminal of the transistor 123 is connected to the node 11. A gate of the transistor 123 is connected to the line 116. Thus, also in the period E, the potential of the line 114 can be applied to the node 11. Consequently, noise in the node 11 can be reduced.

Figure 4D:
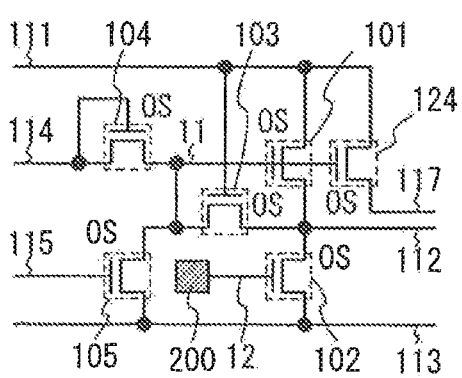

FIG. 4D shows an example of the circuit shown in FIG. 1A including a transistor 124. The circuits shown in FIGS. 1B to 1F and FIGS. 4A to 4C can include the transistor 124 in the same way. A first terminal of the transistor 124 is connected to the line 111. A second terminal of the transistor 124 is connected to a line 117. A gate of the transistor 124 is connected to the node 11. Thus, the potential of the line 117 can be changed at the same timing as the potential of the line 112. In this case, one of the line 112 and the line 117 is connected to a load, and the other is connected to another circuit. Hence, the other of the circuit can be driven without being affected by the change in the potential of the one of the line 112 and the line 117 due to the load.

Figure 4E:
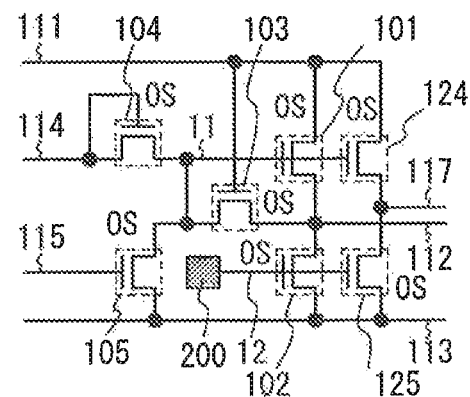

FIG. 4E shows an example of the circuit shown in FIG. 1A including the transistor 124 and a transistor 125. The circuits shown in FIGS. 1B to 1F and FIGS. 4A to 4C can include the transistor 124 and the transistor 125 in the same way. A first terminal of the transistor 125 is connected to the line 113. A second terminal of the transistor 125 is connected to the line 117. A gate of the transistor 125 is connected to the node 12. Thus, the potential of the line 117 can be kept to be V2. Alternatively, noise in the line 117 can be reduced.

Figure 4F:
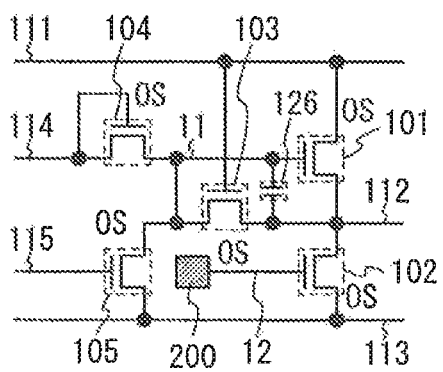

FIG. 4F shows an example of the circuit shown in FIG. 1A including a capacitor 126. The circuits shown in FIGS. 1B to 1F and FIGS. 4A to 4E can include the capacitor 126 in the same way. The capacitor 126 is placed between the gate and the second terminal of the transistor 101.

Note that the circuits shown in FIGS. 1B to 1F can each include two or more elements selected from the capacitor 126 and the transistors 121 to 125.

Figure 5A:
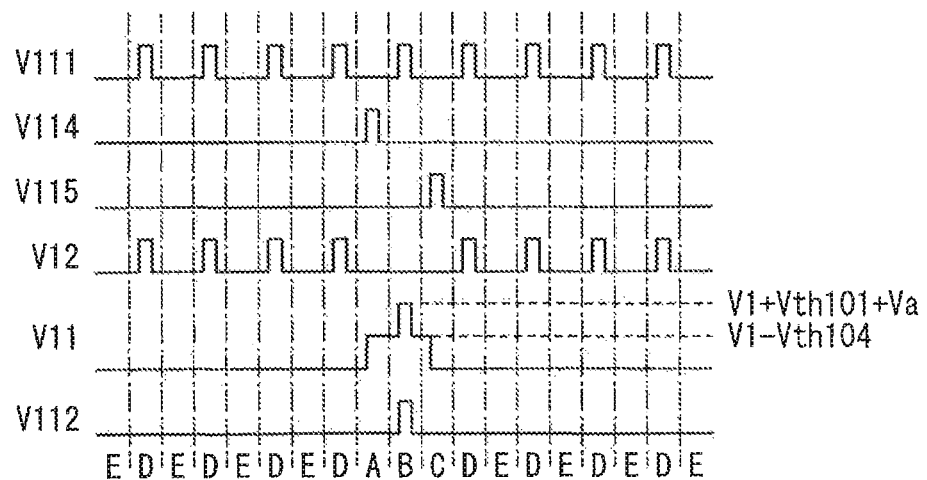
FIGS. 5A and 5B are timing diagrams for describing the operation of the circuit of Embodiment 1.
Figure 5B:
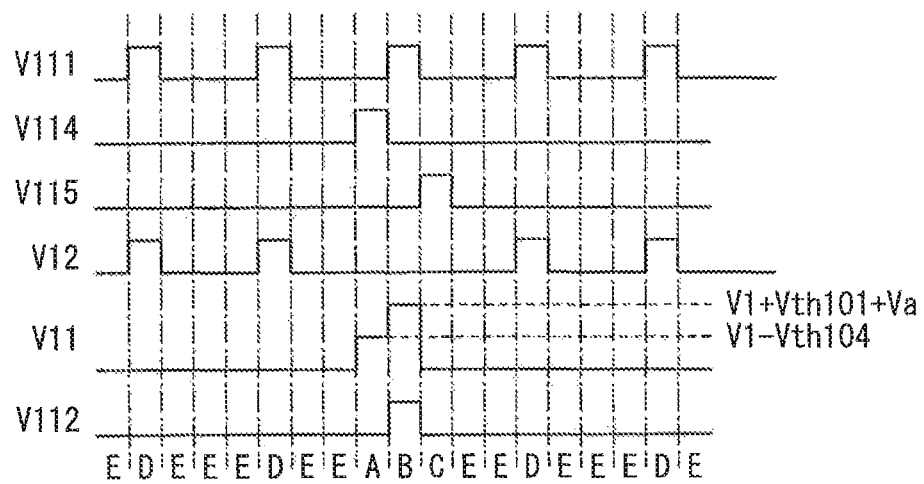

Not only the timing diagram of FIG. 2A but also various other timing diagrams can be applied to the circuits of this embodiment. An example will be described. For example, the potential of the node 12 is preferably less than V2+Vth102 at least in the period B of the periods A to E. In this case, in the periods A, C, D, and E, the potential of the node 12 can be less than V2+Vth102 or more than V2+Vth102. Note that in one of the period D and the period E (the period D in particular), the potential of the node 12 is preferably a value exceeding V2+Vth102, and in the other of the period D and the period E (the period E in particular), the potential of the node 12 is preferably less than V2+Vth102. Hence, it is possible to shorten the time during which the transistor 102 is on and thus to suppress shifts in the threshold voltage of the transistor 102. Note that for the circuit shown in FIG. 1C, in the period A, the transistor 103 is turned on when the potential of the node 12 exceeds V2+Vth102, causing a reduction in the potential of the node 11. For this reason, in the period A, the potential of the node 12 is preferably less than V2+Vth102. As another example, a signal inputted to the line 111 can be non-balanced, as shown in FIG. 5A. Thus, in the period C, the timing of when the potential of the line 115 becomes V1 can be later than the timing of when the potential of the line 111 becomes V2. Consequently, the fall time of V112 can be shortened. As another example, a signal inputted to the line 111 can be a multiphase clock signal, as shown in FIG. 5B. Consequently, power consumption can be reduced. Note that FIG. 5B is an example of a timing diagram obtained when a four-phase clock signal is inputted to the line 111.

The W/L (W: channel width and L: channel length) ratio of the transistor 101 is preferably higher than those of the transistor 103, the transistor 104, the transistor 105, the transistor 121, the transistor 122, the transistor 123, the transistor 124, and the transistor 125. Consequently, it is possible to shorten the rise time and the fall time of V112. Specifically, the W/L ratio of the transistor 101 is preferably twice or more and less than 20 times the W/L ratio of the transistor 104, more preferably 3 times or more and less than 15 times the W/L ratio of the transistor 104, still more preferably 5 times or more and less than 12 times the W/L ratio of the transistor 104. As another example, the W/L ratio of the transistor 105 is preferably lower than that of the transistor 104. Consequently, in the period C, it is possible to delay the timing of when the transistor 101 is turned off and thus shorten the fall time of V112. Specifically, the W/L ratio of the transistor 105 is preferably 0.3 times or more and less than 1 time the W/L ratio of the transistor 104, more preferably 0.4 to 0.9 times the W/L ratio of the transistor 104, still more preferably 0.5 to 0.8 times the W/L ratio of the transistor 104. As another example, the W/L ratio of the transistor 103 is preferably lower than that of the transistor 104. Consequently, it is possible to prevent the potential of the node 11 from decreasing too much in the period B. Specifically, the W/L ratio of the transistor 103 is preferably 0.1 times or more and less than 1 time the W/L ratio of the transistor 104, more preferably 0.3 to 0.9 times the W/L ratio of the transistor 104, still more preferably 0.4 to 0.7 times the W/L ratio of the transistor 104.

For example, the W/L ratio of the transistor 122 is preferably higher than that of the transistor 102. Consequently, it is possible to shorten the fall time of V112. Specifically, the W/L ratio of the transistor 122 is preferably twice or more and less than 20 times the W/L ratio of the transistor 102, more preferably 3 to 15 times the W/L ratio of the transistor 102, still more preferably 5 times or more and less than 10 times the W/L ratio of the transistor 102. As another example, the W/L ratio of the transistor 124 is preferably lower than that of the transistor 101. This is because a load connected to the line 117 is lighter than that connected to the line 112 in many cases. As another example, the W/L ratio of the transistor 125 is preferably lower than that of the transistor 102. This is because a load connected to the line 117 is lighter than that connected to the line 112 in many cases.

For example, the amplitude voltage of the node 12 is preferably less than the amplitude voltage of at least one of the node 11, the line 111, the line 112, the line 114, the line 115, the line 116, and the line 117. Consequently, it is possible to reduce power consumption. Specifically, the amplitude voltage of the node 12 is preferably 0.3 times or more and less than 1 time the amplitude voltage of the line 111, more preferably 0.5 times or more and less than 1 time the amplitude voltage of the line 111, still more preferably 0.6 to 0.9 times the amplitude voltage of the line 111. As another example, the amplitude voltage of the node 11 preferably exceeds the amplitude voltage of at least one of the node 12, the line 111, the line 112, the line 114, the line 115, the line 116, and the line 117. Consequently, it is possible to increase a potential difference between the gate and the source of the transistor 101 and thus to shorten the rise time and the fall time of V112. Specifically, the amplitude voltage of the node 11 is preferably more than the amplitude voltage of the line 111 and twice or less the amplitude voltage of the line 111, more preferably 1.2 to 1.8 times the amplitude voltage of the line 111, still more preferably 1.4 to 1.6 times the amplitude voltage of the line 111.

For example, the time during which the transistor 102 is off is preferably longer than the time during which V111 is high.

Note that in a technique using amorphous silicon, the mobility of a transistor is low. Further, it is necessary to increase the channel width of the transistor 101 in order that the transistor 101 may drive a heavy load (e.g., a gate line). Consequently, the channel width of the transistor 101 is larger than the width of the line 111. In contrast, the mobility of the transistor used in the circuit of this embodiment is higher than that of a transistor using amorphous silicon. Consequently, it is possible to reduce the channel width of the transistor 101.

For this reason, the channel width of the transistor 101 is preferably smaller than at least one of the widths of the line 111. Specifically, the channel width of the transistor 101 is preferably 0.3 times or more and less than 1 time the width of the line 111, more preferably 0.4 to 0.9 times as large as the width of the line 111, still more preferably 0.5 to 0.8 times as large as the width of the line 111.

Figure 7A:
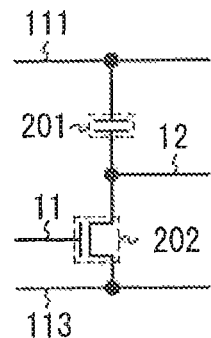
FIG. 7A is a diagram showing a configuration of a circuit of Embodiment 1.
Figure 7B:
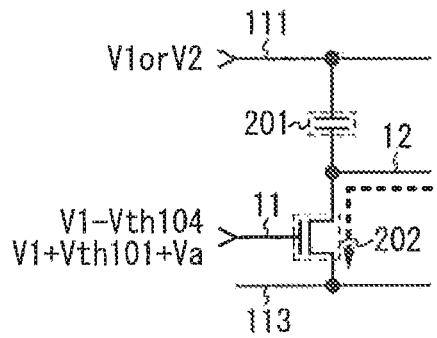
FIGS. 7B to 7F are schematic views for describing the operation of the circuit of Embodiment 1.
Figure 7C:
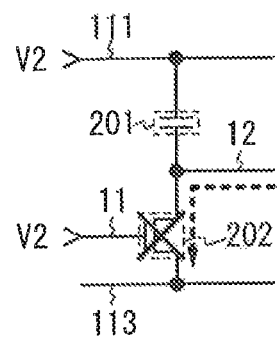
Figure 7D:
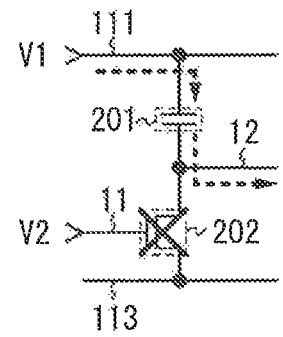
Figure 7E:
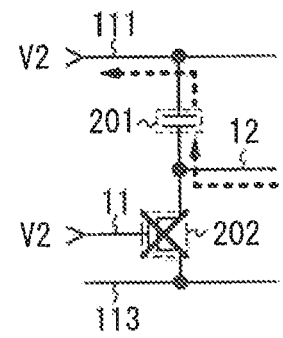

Next, a specific example of the circuit 200 will be described. FIG. 7A shows an example of the configuration of the circuit 200 including a capacitor 201 and a transistor 202. One electrode of the capacitor 201 is connected to the line 111. The other electrode of the capacitor 201 is connected to the node 12. A first terminal of the transistor 202 is connected to the line 113. A second terminal of the transistor 202 is connected to the node 12. A gate of the transistor 202 is connected to the node 11. Note that the gate of the transistor 202 can be connected to the line 112 or the line 114.

Next, an example of the operation of the circuit 200 will be described with reference to FIGS. 7B to 7F.

In the period A and the period B, the potential of the node 11 can be a high potential (e.g., a value exceeding V2+Vth202 (Vth202 is the threshold voltage of the transistor 202)). For example, the value of the potential of the node 11 is V1−Vth104 in the period A, and V1+Vth101+Va in the period B. Consequently, the transistor 202 is turned on, and continuity between the line 113 and the node 12 is established. The potential of the line 113 is therefore applied to the node 12. Since the potential of the line 113 is V2, the potential of the node 12 becomes V2 (see FIG. 7B).

In the period C, the potential of the line 111 becomes V2. The transistor 202 remains on here, so that continuity between the line 113 and the node 12 remains established. Consequently, the potential of the line 113 is still applied to the node 12, so that the potential of the node 12 remains to be V2. Here, a potential difference between the line 111 and the node 12 is held in the capacitor 201. Then, the potential of the node 11 becomes V2. Consequently, the transistor 202 is turned off, and continuity between the line 113 and the node 12 is broken. The node 12 becomes therefore floating. Note that the potential of the node 12 is kept to be V2 by the capacitor 201 (see FIG. 7C).

In the period D, the potential of the node 11 remains to be V2. Consequently, the transistor 202 remains off, so that continuity between the line 113 and the node 12 remains broken. The potential of the line 111 becomes V1 here. The potential of the node 12 is therefore increased by capacitive coupling of the capacitor 201 (see FIG. 7D). In the period E, the potential of the node 11 remains to be V2. Thus, the transistor 202 remains off, so that continuity between the line 113 and the node 12 remains broken. The potential of the line 111 becomes V2 here. Consequently, the potential of the node 12 is decreased by capacitive coupling of the capacitor 201 (see FIG. 7E).

As described above, a circuit in which the potential of the node 12 can be controlled can be formed with a few elements.

Figure 7F:
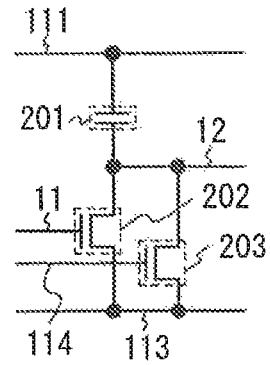

Note that as shown in FIG. 7F, it is possible to form a transistor 203 in the circuit shown in FIG. 7A. A first terminal of the transistor 203 is connected to the line 113. A second terminal of the transistor 203 is connected to the node 12. A gate of the transistor 203 is connected to the line 114. The transistor 203 is on in the period A, and is off in the periods B to E. The potential of the line 113 is therefore applied to the node 12 in the period A, allowing the fall time of V12 in the period A to be shortened. When the gate of the transistor 203 is connected to the line 115, the transistor 203 is on in the period C, and off in the periods A, B, D, and E. Thus, in the period C, the potential of the line 113 is applied to the node 12, so that a voltage required for the capacitor 201 to operate can be held with reliability. Alternatively, in the period C, the time required for the capacitor 201 to hold a voltage can be made longer, so that the capacitance of the capacitor 201 can be increased. If the capacitance of the capacitor 201 is large, the potential of the node 12 in the period D can be increased.

In this embodiment, for example since the off-state current of the transistor 202 is low, the amount of charge lost from the capacitor 201 can be reduced. Thus, it is possible to suppress a reduction in the high potential of the node 12 and an increase in the low potential of the node 12. Therefore, it is possible to extend the time from the start of the period A to the start of the next period A. Thus, the drive frequency can be lowered. As a result, the range of the drive frequency at which the semiconductor device can operate can be widened.

Figure 6A:
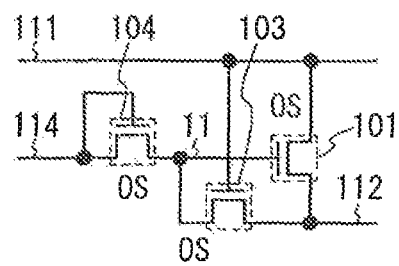
FIGS. 6A to 6F are diagrams showing configurations of circuits of Embodiment 1.
Figure 6B:
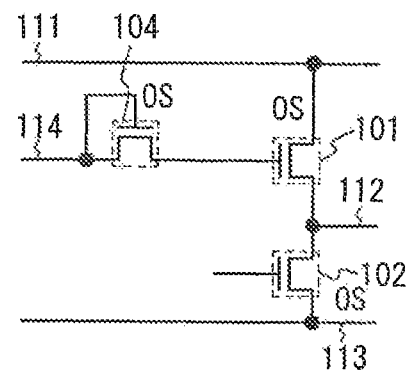
Figure 6C:
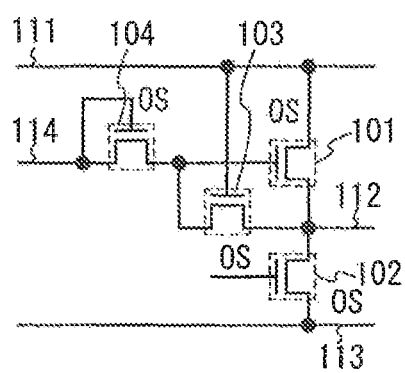
Figure 6D:
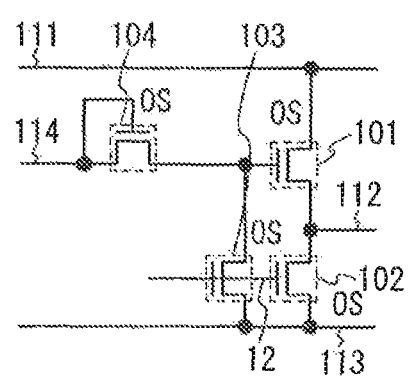
Figure 6E:
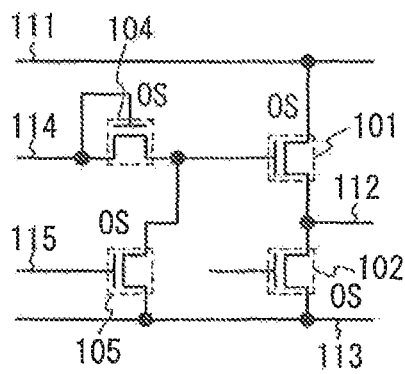
Figure 6F:
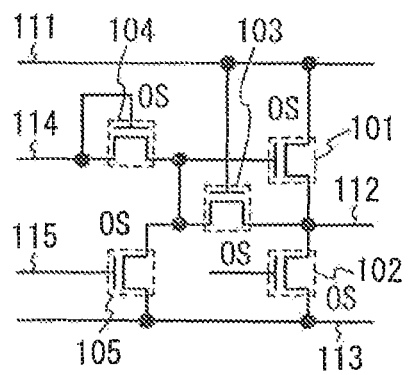

Of the circuits of this embodiment, each of the following structures is one embodiment of the present invention: the semiconductor device including the transistor 101, the transistor 103, and the transistor 104 (see FIG. 6A); the semiconductor device including the transistor 101, the transistor 102, and the transistor 104 (see FIG. 6B); the semiconductor device including the transistor 101, the transistor 102, the transistor 103, and the transistor 104 (see FIGS. 6C and 6D); the semiconductor device including the transistor 101, the transistor 102, the transistor 104, and the transistor 105 (see FIG. 6E); and the semiconductor device including the transistor 101, the transistor 102, the transistor 103, the transistor 104, and the transistor 105 (see FIG. 6F).

Embodiment 2

In this embodiment, a shift register circuit in a display device which is one embodiment of the present invention will be described. A shift register circuit of this embodiment can include any of the circuits of Embodiment 1. Further, the shift register circuit of this embodiment can be used as a driver circuit of a display device, such as a gate driver circuit and/or a source driver circuit.

Figure 8:
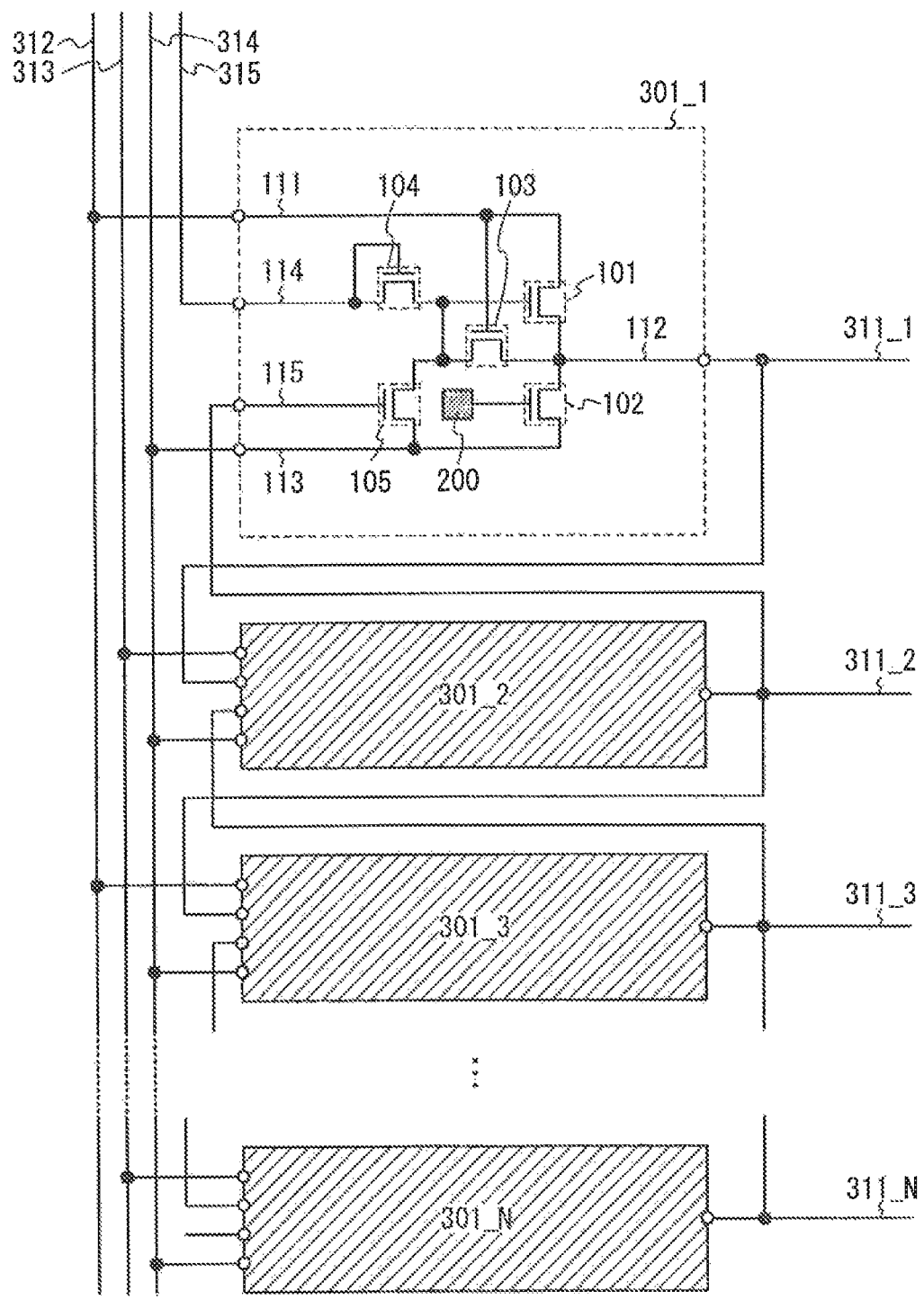
FIG. 8 is a diagram showing a configuration of a shift register circuit of Embodiment 2.

FIG. 8 shows an example of the configuration of a shift register circuit that includes N pieces of circuits 301 (circuits 301_1 to 301_N). Any of the circuits described in Embodiment 1 can be used as the circuit 301. FIG. 8 shows an example of the case where the circuit shown in FIG. 1A is used as the circuit 301.

Connections in the shift register circuit shown in FIG. 8 will be described. Connections in a circuit 301_$i$ ($i$ is included in 2 to N−1) will be described as an example. The circuit 301_$i$ is connected to a line 311_$i$, a line 311_$i$−1, a line 311_$i$+1, either a line 312 or a line 313, and a line 314. Specifically, in the circuit 301_$i$, the line 112 is connected to the line 311_$i$; the line 114 is connected to the line 311_$i$−1; the line 115 is connected to the line 311_$i$+1; the line 111 is connected to either the line 312 or the line 313; and the line 113 is connected to the line 314. Note that in the case where the line 111 is connected to the line 312 in the circuit 301_$i$, the line 111 is connected to the line 313 in a circuit 301_$i$+1 and a circuit 301_$i$−1. The circuit 301_1 differs from the circuit 301_$i$ in that the line 114 is connected to a line 315. The circuit 301_N differs from the circuit 301_$i$ in that the line 115 is connected to an output terminal of a dummy circuit (not illustrated), a line to which a reset signal is inputted (not illustrated), or the line 315, or the like.

Figure 9:
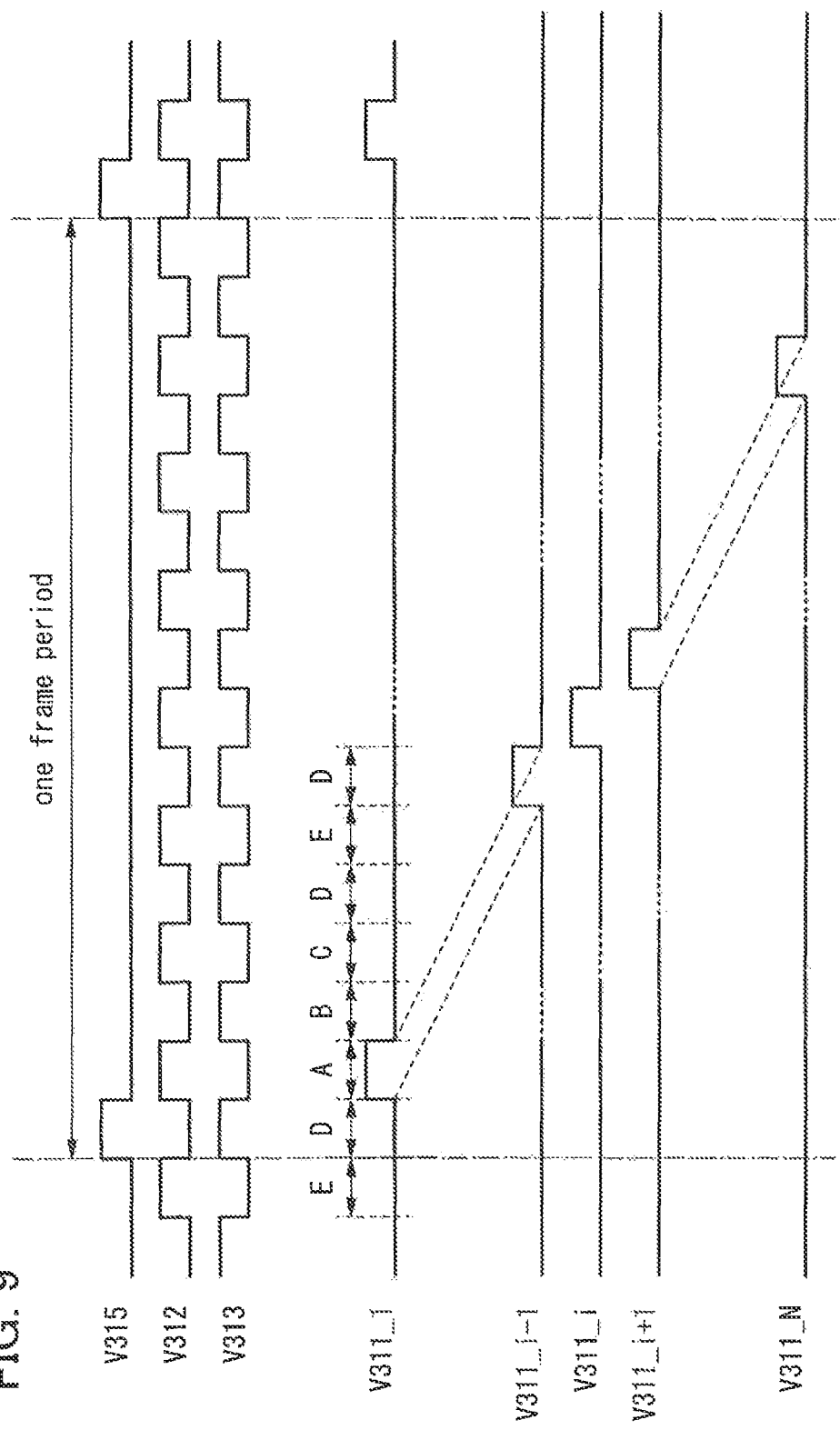
FIG. 9 is a timing diagram for describing the operation of the shift register circuit of Embodiment 2.

The operation of the shift register circuit shown in FIG. 8 will be described with reference to a timing diagram of FIG. 9.

An example of the operation of the circuit 301_$i$ will be described. First, the potential of the line 311_$i$−1 (potential V311_$i$−1) becomes V1. Then, the circuit 301_$i$ performs the operation of the period A, so that the potential of the line 311_$i$ (potential V311_$i$) becomes V2. After that, the potential of the line 312 (potential V312) and the potential of the line 313 (potential V313) are inverted. Then, the circuit 301_$i$ performs the operation of the period B, so that the potential of the line 311_$i$ becomes V1. After that, the potential of the line 312 and the potential of the line 313 are inverted, so that the potential of the line 311_$i$+1 (potential V311_$i$+1) becomes V1. Then, the circuit 301_$i$ performs the operation of the period C, so that the potential of the line 311_$i$ becomes V2. After that, the circuit 301_$i$ repeats the operation of the period D and the operation of the period E in order until the potential of the line 311_$i$−1 becomes V1 again, so that the potential of the line 311_$i$ remains to be V2. Note that the circuit 301_1 differs from the circuit 301_i in that it performs the operation of the period A when the potential of the line 315 (potential V315) becomes V1.

As described above, the potentials of the lines 311_1 to 311_N (potentials V311_1 to V311_N) can become V1 in order.

An output signal of the shift register circuit is inputted to the line 311. A clock signal is inputted to the line 312. A clock signal that is out of phase with the clock signal inputted to the line 312 or a signal obtained by inverting the clock signal inputted to the line 312 is inputted to the line 313. The voltage V2 is applied to the line 314. A start signal is inputted to the line 315.

The line 311 is used for transmitting an output signal of the shift register circuit to a circuit such as a pixel circuit or a demultiplexer. The line 311 functions as a signal line or a gate line. Each of the line 312 and the line 313 is used for transmitting a signal such as a clock signal from an external circuit such as a controller to the shift register circuit of this embodiment. Each of the line 312 and the line 313 functions as a signal line or a clock line. The line 314 is used for supplying power supply voltage such as the voltage V2 from an external circuit such as a power supply circuit to the shift register circuit of this embodiment. The line 314 functions as a power supply line, a negative supply line, or a ground line. The line 315 is used for transmitting a start signal from an external circuit such as a controller to the shift register circuit of this embodiment. The line 315 functions as a signal line.

Figure 10:
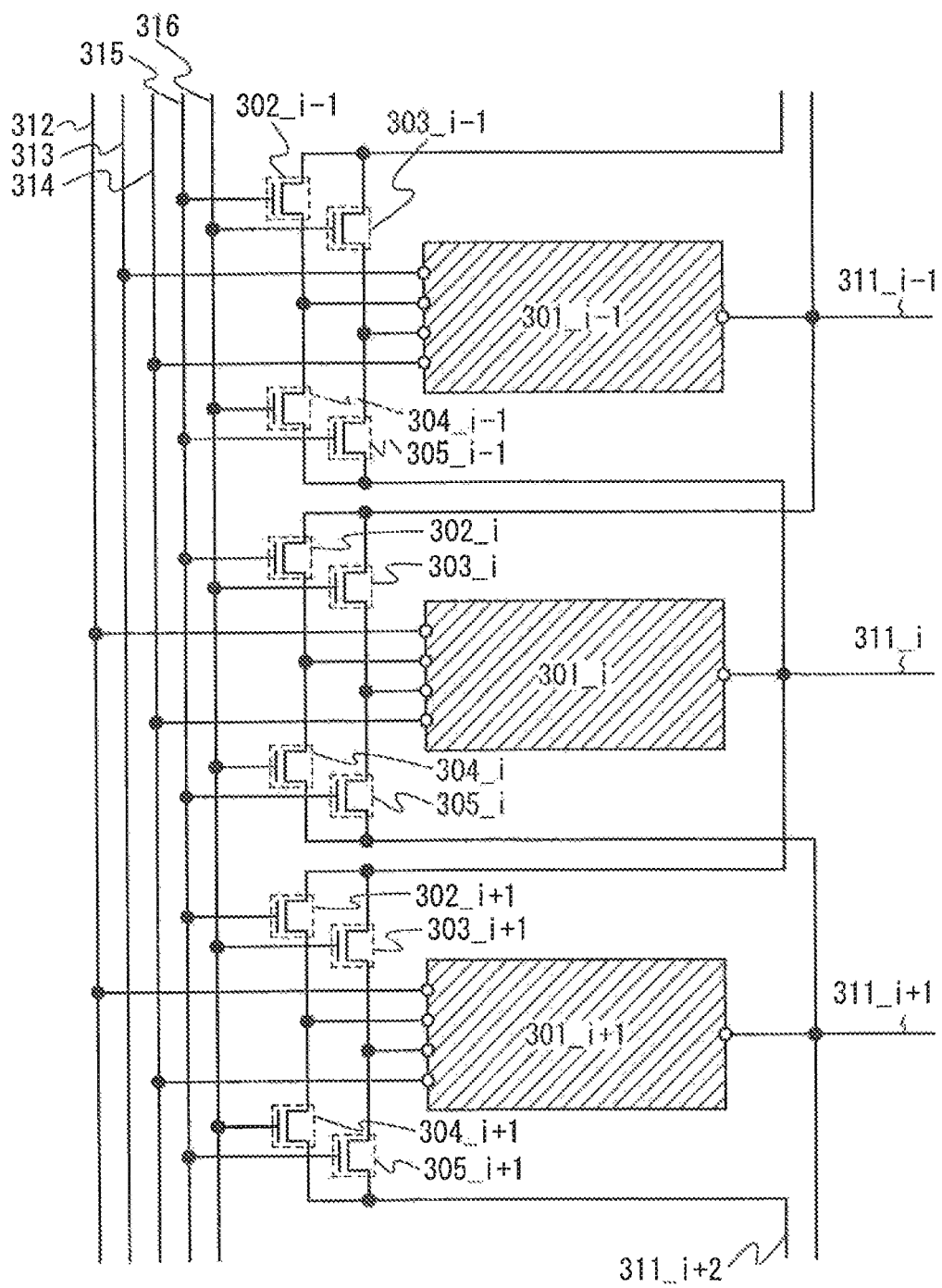
FIG. 10 is a diagram showing a configuration of a shift register circuit of Embodiment 2.

The shift register circuit shown in FIG. 8 can have a function of switching the scanning direction when the shift register includes transistors. That is, the shift register circuit can switch a driving method in which the potentials of the lines 311_1 to 311_N become V1 in order and a driving method in which the potentials of the lines 311_N to 311_1 become V1 in order. FIG. 10 shows an example of the shift register circuit including switches for changing the scanning direction. FIG. 10 shows circuits 301_i−1 to 301_i+1 as an example. The shift register circuit shown in FIG. 10 includes N number of circuits 301, N number of transistors 302 (transistors 302_1 to 302_N), N number of transistors 303 (transistors 303_1 to 303_N), N transistors 304 (transistors 304_1 to 304_N), and N transistors 305 (transistors 305_1 to 305_N). For example, a first terminal of the transistor 302_i is connected to a line 311_i−1; a second terminal of the transistor 302_i is connected to the line 114 of the circuit 301_i; and a gate of the transistor 302_i is connected to the line 315. A first terminal of the transistor 303_i is connected to the line 311_i−1; a second terminal of the transistor 303_i is connected to the line 115 of the circuit 301_i; and a gate of the transistor 303_i is connected to the line 316. A first terminal of the transistor 304_i is connected to a line 311_i+1; a second terminal of the transistor 304_i is connected to the line 114 of the circuit 301_i; and a gate of the transistor 304_i is connected to the line 316. A first terminal of the transistor 305_i is connected to the line 311_i+1; a second terminal of the transistor 305_i is connected to the line 115 of the circuit 301_i; and a gate of the transistor 305_i is connected to the line 315.

An example of the operation of the shift register circuit shown in FIG. 10 will be described. In the driving method in which the potentials of the lines 311_1 to 311_N become V1 in order, an H-level signal is preferably inputted to the line 315, and an L-level signal is preferably inputted to the line 316. Consequently, the transistor 302_i is turned on, the transistor 303_i is turned off, the transistor 304_i is turned off, and the transistor 305_i is turned on. Thus, a signal outputted from the line 311_i is inputted to the line 114 of the circuit 301_i+1 and the line 115 of the circuit 301_i−1. In the driving method in which the potentials of the lines 311_N to 311_1 become V1 in order, line 315 an L-level signal is preferably inputted to the line 315, and an H-level signal is preferably inputted to the line 316. Consequently, the transistor 302_i is turned off, the transistor 303_i is turned on, the transistor 304_i is turned on, and the transistor 305_i is turned off. Thus, a signal outputted from the line 311_i is inputted to the line 115 of the circuit 301_i+1 and the line 114 of the circuit 301_i−1.

Note that the amplitude voltage of a signal inputted to one or both of the line 315 and the line 316 is preferably higher than that of a signal inputted to at least one of the N number of lines 311, the line 312, and the line 313.

Embodiment 3

In this embodiment, an example of a transistor included in the circuit of Embodiment 1 or 2 will be described. Specifically, examples of the structure of a transistor whose channel region is formed using an oxide semiconductor and fabrication steps thereof will be described.

As the oxide semiconductor, the following oxides can be used: an In—Sn—Ga—Zn—O-based oxide semiconductor that is an oxide of four metal elements; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor that is an oxide of three metal elements; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor that is an oxide of two metal elements; an In—O-based oxide semiconductor; a Sn—O-based oxide semiconductor; a Zn—O-based oxide semiconductor; and the like. Further, $SiO_2$ may be contained in the oxide semiconductor.

For the oxide semiconductor, a substance represented by $InMO_3(ZnO)_m$ (m>0, where m is not a natural number) can be used. Here, M denotes one or more metal elements selected from Ga, Al, Mn, or Co. For example, M can be Ga, Ga and Al, Ga and Mn, Ga and Co, or the like. Among oxide semiconductor semiconductors whose composition formulae are expressed by $InMO_3(ZnO)_m$ (m>0, where m is not a natural number), an oxide semiconductor which includes Ga as M is referred to as the In—Ga—Zn—O-based oxide semiconductor, and a thin film of the In—Ga—Zn—O-based oxide semiconductor is also referred to as an In—Ga—Zn—O-based film. In addition, an oxide semiconductor material expressed by In—Ga—Zn—O in this specification is $InGaO_3(ZnO)_m$ (m>0, where m is not a natural number), and it can be confirmed by analysis using ICP-MS or RBS that m is not a natural number.

An example of a method for fabricating a transistor whose channel region is formed using an oxide semiconductor will be described with reference to FIGS. 11A to 11D.

FIGS. 11A to 11D illustrate an example of the cross-sectional structure of a transistor. A transistor 410 shown in FIGS. 11A to 11D is a bottom-gate channel-etched transistor.

Although a single-gate transistor is shown in FIGS. 11A to 11D, a multi-gate transistor including a plurality of channel regions can be formed when needed.

Steps of forming the transistor 410 over a substrate 400 will be described below with reference to FIGS. 11A to 11D.

First, a conductive film is formed over the substrate 400 having an insulating surface. Then, a gate electrode layer 411 is formed through a first photolithography process.

Although there is no particular limitation on a substrate which can be used as the substrate 400 having an insulating surface, it is necessary that the substrate have at least heat resistance high enough to withstand heat treatment to be performed later. For example, a glass substrate including barium borosilicate glass, aluminoborosilicate glass, or the like can be used. In the case where the temperature of the heat treatment to be performed later is high, a glass substrate whose strain point is 730° C. or higher is preferably used.

An insulating film serving as a base film may be provided between the substrate 400 and the gate electrode layer 411. The base film has a function of preventing diffusion of an impurity element from the substrate 400, and can be formed to have a single-layer structure or a layered structure including one or more films selected from a silicon nitride film, a silicon oxide film, a silicon nitride oxide film, or a silicon oxynitride film.

The gate electrode layer 411 can be formed to have a single-layer structure or a layered structure including a metal material such as molybdenum, titanium, chromium, tantalum, tungsten, aluminum, copper, neodymium, or scandium; or an alloy material which contains the metal material as its main component.

Then, a gate insulating layer 402 is formed over the gate electrode layer 411.

The gate insulating layer 402 can be formed to have a single-layer structure or a layered structure including a silicon oxide layer, a silicon nitride layer, a silicon oxynitride layer, a silicon nitride oxide layer, or an aluminum oxide layer by plasma-enhanced CVD, sputtering, or the like. Alternatively, a high-k material such as hafnium oxide ($HfO_x$) or tantalum oxide ($TaO_x$) can be used for the gate insulating layer. The thickness of the gate insulating layer 402 is 100 to 500 nm. In the case where the gate insulating layer 402 is formed to have a layered structure, a first gate insulating layer having a thickness of 50 to 200 nm and a second gate insulating layer having a thickness of 5 to 300 nm are stacked.

In this embodiment, as the gate insulating layer 402, a silicon oxynitride layer is formed to a thickness of 100 nm or less by plasma-enhanced CVD.

Further, as the gate insulating layer 402, a silicon oxynitride film may be formed using a high-density plasma apparatus. Here, a high-density plasma apparatus refers to an apparatus which can realize a plasma density of $1 \times 10^{11}/cm^3$ or higher. For example, plasma is generated by application of a microwave power of 3 to 6 kW so that an insulating film is formed. Since the insulating film formed using the high-density plasma apparatus can have a uniform thickness, the insulating film has excellent step coverage. Further, as for the insulating film formed using the high-density plasma apparatus, the thickness of a thin film can be controlled precisely.

The insulating film formed using the high-density plasma apparatus is greatly different from an insulating film formed using a conventional parallel plate PCVD apparatus. The etching rate of the insulating film formed using the high-density plasma apparatus is lower than that of the insulating film formed using the conventional parallel plate PCVD apparatus by 10% or more or 20% or more in the case where the etching rates with the same etchant are compared to each other. Thus, it can be said that the insulating film formed using the high-density plasma apparatus is a dense film.

An oxide semiconductor (a highly purified oxide semiconductor) which is made to be intrinsic (i-type) or substantially intrinsic in a later step is highly sensitive to an interface state and interface charge; thus, an interface between the oxide semiconductor and the gate insulating layer is important. Thus, the gate insulating layer (GI) which is in contact with the highly purified oxide semiconductor needs high quality. Therefore, high-density plasma-enhanced CVD using microwaves (2.45 GHz) is preferable because a dense high-quality insulating film having a high withstand voltage can be formed. This is because when the highly purified oxide semiconductor is in close contact with the high-quality gate insulating layer, the interface state can be reduced and interface properties can be favorable. It is important that the gate insulating layer have lower interface state density with an oxide semiconductor and a favorable interface as well as having favorable film quality as a gate insulating layer.

Then, an oxide semiconductor film 430 is formed to a thickness of 2 to 200 nm over the gate insulating layer 402. As the oxide semiconductor film 430, an In—Ga—Zn—O-based oxide semiconductor film, an In—Zn—O-based oxide semiconductor film, or the like is used. In this embodiment, the oxide semiconductor film 430 is deposited by sputtering with the use of an In—Ga—Zn—O-based oxide semiconductor target. A cross-sectional view at this stage corresponds to FIG. 11A. Alternatively, the oxide semiconductor film 430 can be deposited by sputtering in a rare gas (typically argon) atmosphere, an oxygen atmosphere, or an atmosphere including a rare gas (typically argon) and oxygen.

Here, deposition is performed using a metal oxide target containing In, Ga, and Zn ($In_2O_3$:$Ga_2O_3$:ZnO=1:1:1 [molar ratio]). The deposition condition is set as follows: the distance between the substrate and the target is 100 mm; the pressure is 0.2 Pa; the direct current (DC) power is 0.5 kW; and the atmosphere is an atmosphere containing argon and oxygen (argon: oxygen=30 sccm:20 sccm and the flow rate ratio of oxygen is 40%). Note that it is preferable that pulsed direct-current (DC) power be used because powdery substances generated in deposition can be reduced and the film thickness can be uniform. The thickness of an In—Ga—Zn—O-based film is 5 to 200 nm. In this embodiment, as the oxide semiconductor film, a 20-nm-thick In—Ga—Zn—O-based film is deposited by sputtering with the use of an In—Ga—Zn—O-based metal oxide target. Next, the oxide semiconductor film 430 is processed into an island-shaped oxide semiconductor layer through a second photolithography process.

Then, the oxide semiconductor layer is dehydrated or dehydrogenated. The temperature of first heat treatment for dehydration or dehydrogenation is 400 to 750° C., preferably higher than or equal to 400° C. and lower than the strain point of the substrate. Here, after the substrate is put in an electric furnace which is a kind of heat treatment apparatus and heat treatment is performed on the oxide semiconductor layer at 450° C. for one hour in a nitrogen atmosphere, water and hydrogen are prevented from being mixed into the oxide semiconductor layer again by preventing the substrate from being exposed to the air; thus, oxide semiconductor layer 431 is obtained (see FIG. 11B).

Note that the heat treatment apparatus is not limited to an electric furnace, and may be provided with a device for heating an object to be processed by thermal conduction or thermal radiation from a heater such as a resistance heater. For example, an RTA (rapid thermal annealing) apparatus such as a GRTA (gas rapid thermal annealing) apparatus or an LRTA (lamp rapid thermal annealing) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. As the gas, an inert gas which does not react with an object to be processed by heat treatment, such as nitrogen or a rare gas such as argon, is used.

For example, as the first heat treatment, GRTA may be performed as follows. The substrate is transferred and put in an inert gas heated at a high temperature of 650 to 700° C., is heated for several minutes, and is transferred and taken out of the inert gas heated at the high temperature. GRTA enables short-time high-temperature heat treatment.

Note that in the atmosphere of the first heat treatment, it is preferable that water, hydrogen, or the like be not contained in nitrogen, a rare gas such as helium, neon, or argon, or dry air. For example, the purity of nitrogen or a rare gas such as helium, neon, or argon which is introduced into the heat treatment apparatus is preferably 6N (99.9999%) or higher, more preferably 7N (99.99999%) or higher (that is, the impurity concentration is 1 ppm or lower, preferably 0.1 ppm or lower).

In addition, the first heat treatment for the oxide semiconductor layer can be performed on the oxide semiconductor film 430 before being processed into the island-shaped oxide semiconductor layer. In that case, the substrate is taken out of the heat apparatus after the first heat treatment, and then the second photolithography process is performed.

Further, in the case where an opening portion is formed in the gate insulating layer 402, the formation of the opening portion may be performed before or after the oxide semiconductor film 430 is dehydrated or dehydrogenated.

Note that the etching of the oxide semiconductor film 430 here is not limited to wet etching, and may be dry etching.

As an etching gas used for dry etching of the oxide semiconductor film 430, a gas containing chlorine (e.g., chlorine ($Cl_2$) or boron trichloride ($BCl_3$)) is preferably used. As an etchant used for wet etching of the oxide semiconductor film 430, a solution obtained by mixture of phosphoric acid, acetic acid, and nitric acid, an ammonia hydrogen peroxide mixture (a hydrogen peroxide solution at 31 wt %: ammonia water at 28 wt %: water=5:2:2), or the like can be used. Alternatively, ITO-07N (produced by KANTO CHEMICAL CO., INC.) may be used.

Next, a metal conductive film is formed over the gate insulating layer 402 and the oxide semiconductor layer 431. The metal conductive film may be formed by sputtering or vacuum evaporation. As the material of the metal conductive film, an element selected from aluminum (Al), chromium (Cr), copper (Cu), tantalum (Ta), titanium (Ti), molybdenum (Mo), tungsten (W), neodymium (Nd), or scandium (Sc); an alloy including any of the elements; an alloy including any of these elements in combination; or the like can be used. Alternatively, a nitride film of any of the above-described elements may be used. Alternatively, one or more materials selected from manganese (Mn), magnesium (Mg), zirconium (Zr), beryllium (Be), and yttrium (Y) may be used. Further, the metal conductive film may have a single-layer structure or a layered structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in that order, and the like can be given.

When heat treatment is performed after the formation of the metal conductive film, it is preferable that the metal conductive film have heat resistance high enough to withstand the heat treatment.

Figure 11A:
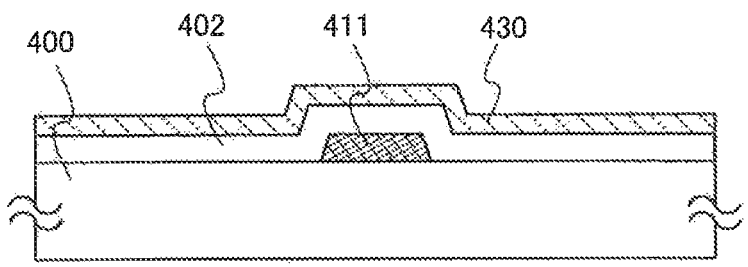
FIGS. 11A to 11D are examples of diagrams for describing steps of fabricating a transistor of Embodiment 3.
Figure 11B:
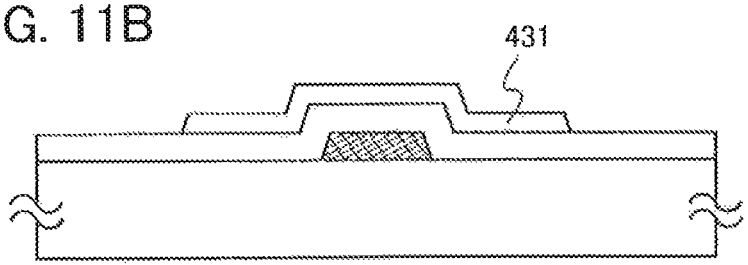
Figure 11C:
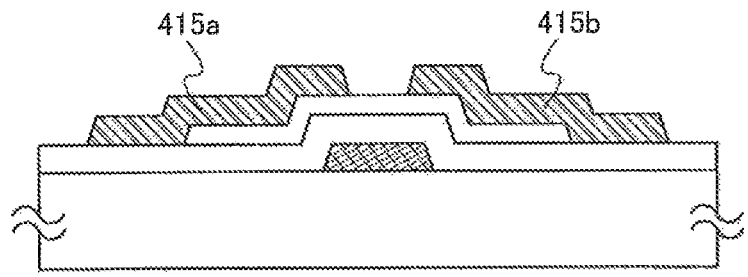
Figure 11D:
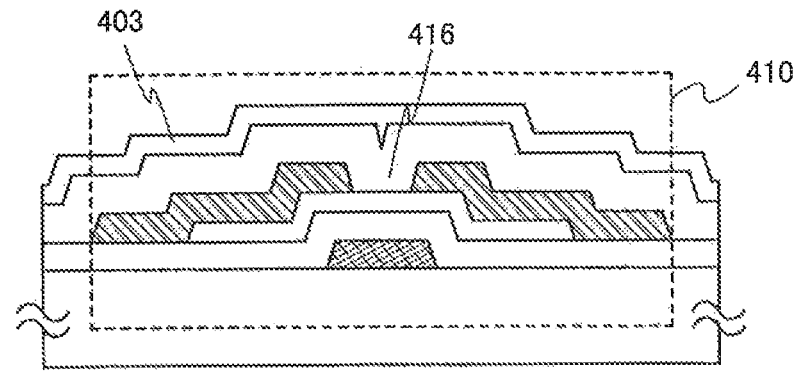

A resist mask is formed over the metal conductive film through a third photolithography process; a source electrode layer 415*a* and a drain electrode layer 415*b* are formed by selective etching; then, the resist mask is removed (see FIG. 11C).

In this embodiment, a titanium film is used as the metal conductive film, an In—Ga—Zn—O-based oxide is used for the oxide semiconductor layer 431, and an ammonia hydrogen peroxide solution (a mixture of ammonia, water, and a hydrogen peroxide solution) is used as an etchant.

Note that in the third photolithography process, only part of the oxide semiconductor layer 431 is etched so that an oxide semiconductor layer having a groove (a depression) is formed in some cases.

In order to reduce the number of photomasks used in the photolithography processes and to reduce the number of processes, an etching process may be performed using a multi-tone mask which is an exposure mask through which light is transmitted to have a plurality of intensities. A resist mask formed using a multi-tone mask has a plurality of thicknesses and can be changed in shape by ashing; therefore, the resist mask can be used in a plurality of etching processes for processing films into different patterns. Therefore, a resist mask corresponding to at least two or more kinds of different patterns can be formed by one multi-tone mask. Thus, the number of exposure masks and the number of corresponding photolithography processes can be reduced, so that the process can be simplified.

Next, plasma treatment is performed using a gas such as nitrous oxide (N20), nitrogen (N2), or argon (Ar). By this plasma treatment, absorbed water and the like which attach to a surface of the oxide semiconductor layer exposed are removed. Alternatively, plasma treatment may be performed using a mixture gas of oxygen and argon.

After the plasma treatment, an oxide insulating layer 416 which serves as a protective insulating film and is in contact with part of the oxide semiconductor layer 431 is formed without exposure to the air.

The oxide insulating layer 416 can be formed to have a thickness of at least 1 nm or more by a method by which an impurity such as water or hydrogen is not mixed into the oxide insulating layer 416, such as sputtering, as appropriate. When hydrogen is contained in the oxide insulating layer 416, hydrogen enters the oxide semiconductor layer, so a backchannel of the oxide semiconductor layer 431 has lower resistance (has n-type conductivity) and a parasitic channel is formed. Therefore, it is important that a deposition method in which hydrogen is not used be employed in order that the oxide insulating layer 416 contain as little hydrogen as possible.

In this embodiment, a 200-nm-thick silicon oxide film is deposited as the oxide insulating layer 416 by sputtering. The substrate temperature at the time of deposition is in the range of room temperature to 300° C., and 100° C. in this embodiment. The silicon oxide film can be deposited by sputtering in a rare gas (typically argon) atmosphere, an oxygen atmosphere, or an atmosphere including a rare gas (typically argon) and oxygen. Further, a silicon oxide target or a silicon target can be used as a target. For example, a silicon oxide film can be deposited using a silicon target in an atmosphere including oxygen and nitrogen by sputtering.

Next, second heat treatment (preferably at 200 to 400° C., for example, 250 to 350° C.) is performed in an inert gas atmosphere, a dry air atmosphere, or an oxygen gas atmosphere. For example, the second heat treatment is performed at 250° C. for one hour in a nitrogen atmosphere. Through the second heat treatment, part of the oxide semiconductor layer (a channel region) is heated while being in contact with the oxide insulating layer 416. Thus, oxygen is supplied to the part of the oxide semiconductor layer (the channel region).

Through the above steps, after the heat treatment for dehydration or dehydrogenation is performed on the oxide semiconductor layer, the part of the oxide semiconductor layer (the channel region) is selectively made to be in an oxygen excess state. These steps allow the transistor 410 to be formed.

Further, heat treatment may be performed at 100 to 200° C. for 1 to 30 hours in an air atmosphere. In this embodiment, the heat treatment is performed at 150° C. for 10 hours. This heat treatment may be performed at a fixed heating temperature. Alternatively, the following change in the heating temperature may be conducted more than once repeatedly. This heat treatment can be performed at a constant heating temperature or follow repeated temperature cycles where the temperature rises from room temperature to a heating temperature of 100 to 200° C. and drops from the a heating temperature to room temperature.

A protective insulating layer may be formed over the oxide insulating layer 416. For example, a silicon nitride film is formed by RF sputtering. Since RF sputtering has high productivity, it is preferably used as a deposition method of the protective insulating layer. The protective insulating layer is formed using an inorganic insulating film which does not contain an impurity such as moisture, a hydrogen ion, and OH⁻ and blocks entry of such an impurity from the outside, typically a silicon nitride film, an aluminum nitride film, a silicon nitride oxide film, or an aluminum oxynitride film. In this embodiment, as the protective insulating layer, a protective insulating layer 403 is formed using a silicon nitride film (see FIG. 11D).

In this embodiment, the oxide semiconductor layer of the transistor 410 is an intrinsic (i-type) or substantially intrinsic oxide semiconductor layer obtained by removal of hydrogen, which is an n-type impurity, from the oxide semiconductor and the increase in purity so that an impurity other than the main components of the oxide semiconductor is included as little as possible. In other words, the oxide semiconductor layer of the transistor 410 is a highly purified intrinsic (i-type) semiconductor layer or a semiconductor layer which is close to a highly purified i-type semiconductor layer not by adding an impurity but by removing an impurity such as hydrogen or water as much as possible. In this manner, the Fermi level ($E_f$) can be equal to the intrinsic Fermi level ($E_i$).

It is said that the band gap ($E_g$) of the oxide semiconductor is 3.15 eV and electron affinity ($\chi$) is 4.3 eV. The work function of titanium (Ti) used for the source electrode layer and the drain electrode layer is substantially equal to the electron affinity ($\chi$) of the oxide semiconductor. In this case, the Schottky electron barrier is not formed at an interface between the metal and the oxide semiconductor.

For example, even in the case of a transistor whose channel width W is $1\times10^4$ µm and whose channel length L is 3 µm, off-state current at room temperature can be $10^{-13}$ A or less and a subthreshold swing can be 0.1 V/decade (the thickness of the gate insulating layer is 100 nm).

By the increase in purity so that an impurity other than the main components of the oxide semiconductor may be included as little as possible in this manner, the transistor 410 can operate in a favorable way.

In order to prevent variation in electrical characteristics of the oxide semiconductor, an impurity that causes the variation, such as hydrogen, moisture, a hydroxyl group, or hydride (also referred to as a hydrogen compound), is intentionally removed. Additionally, the oxide semiconductor becomes a highly purified electrically i-type (intrinsic) oxide semiconductor by supply of oxygen which is a main component of the oxide semiconductor that is simultaneously reduced in a step of removing the impurity.

Therefore, it is preferable that the amount of hydrogen in the oxide semiconductor be as small as possible. Further, the number of carriers in the highly purified oxide semiconductor is significantly small (close to zero), and the carrier density is lower than $1\times10^{12}/cm^3$, preferably $1\times10^{11}/cm^3$ or lower. That is, the carrier density of the oxide semiconductor layer can be extremely close to zero. Since the number of carriers in the oxide semiconductor layer is significantly small, the off-state current of the transistor can be reduced. It is preferable that the off-state current be as low as possible. The amount of current per micrometer of the channel width (W) in the transistor is 100 aA or less, preferably 10 zA (zepto-ampere) or less, more preferably 1 zA or less. Further, the transistor has no PN junction and does not deteriorate due to hot carriers; thus, the electrical characteristics of the transistor are not adversely affected.

In a transistor whose channel region is formed using an oxide semiconductor which is highly purified by drastic removal of hydrogen contained in an oxide semiconductor layer as described above, the off-state current can be extremely low. In other words, in circuit design, the oxide semiconductor layer can be regarded as an insulator when the transistor is off. In contrast, the oxide semiconductor layer is estimated to have better current supply capability than a semiconductor layer including amorphous silicon when the transistor is on.

A thin film transistor including low-temperature polysilicon is designed on the assumption that off-state current is about 10000 times that of a transistor including an oxide semiconductor. Therefore, in the case where the transistor including an oxide semiconductor is compared with the thin film transistor including low-temperature polysilicon, the voltage hold time of the transistor including an oxide semiconductor can be extended about 10000 times when storage capacitances are equal or substantially equal to each other (about 0.1 pF). For example, when moving images are displayed at 60 fps, the hold time for one signal writing can be approximately 160 seconds, which is 10000 times that of the thin film transistor including low-temperature polysilicon. In this manner, still images can be displayed on a display area even by less frequent writing of image signals.

Embodiment 4

In this embodiment, an example of a display device which is one embodiment of the present invention will be described.

Figure 12A:
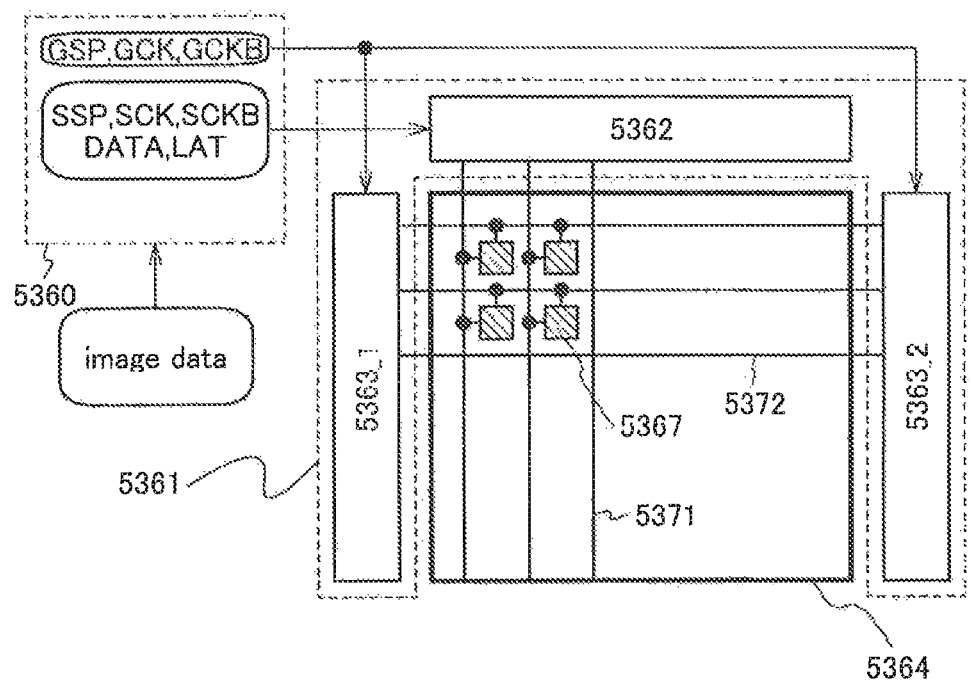
FIGS. 12A to 12C are diagrams showing structures of display devices of Embodiment 4.

FIG. 12A shows an example of a display device including the shift register circuit of Embodiment 2. The display device shown in FIG. 12A includes a timing controller 5360; a driver circuit 5361 including a source driver circuit 5362, a gate driver circuit 5363_1, and a gate driver circuit 5363_2; and a pixel area 5364. A plurality of source lines 5371 which extend from the source driver circuit 5362 and a plurality of gate lines 5372 which extend from the gate driver circuits 5363_1 and 5363_2 are provided in the pixel area 5364. Pixels 5367 are provided in matrix in regions where the plurality of source lines 5371 and the plurality of gate lines 5372 intersect with each other Note that the display device can include a lighting device, a control circuit thereof, and the like. In that case, the pixel 5367 preferably includes a liquid crystal element.

Note that it is possible not to provide one of the gate driver circuit 5363_1 and the gate driver circuit 5363_2.

The timing controller 5360 has a function of controlling the operation of the driver circuit 5361 by supplying a control signal to the driver circuit 5361. For example, the timing controller 5360 supplies a control signal such as a start signal SSP, a clock signal SCK, an inverted clock signal SCKB, a video signal DATA, or a latch signal LAT to the source driver circuit 5362. Further, the timing controller 5360 supplies a control signal such as a start signal GSP, a clock signal GCK, or an inverted clock signal GCKB to the gate driver circuit 5363_1 and the gate driver circuit 5363_2.

The source driver circuit 5362 has a function of outputting video signals to the plurality of source lines 5371. The source driver circuit 5362 can be referred to as a driver circuit, a signal line driver circuit, or the like. Video signals are inputted to the pixels 5367. Display elements included in the pixels 5367 produce a grayscale in accordance with the video signals.

The gate driver circuit 5363_1 and the gate driver 5363_2 each have a function of sequentially selecting the pixels 5367 in each row. Each of the gate driver circuit 5363_1 and the gate driver circuit 5363_2 can be referred to as a driver circuit or a scan line driver circuit. The timing of selecting the pixels 5367 is controlled when the gate driver circuit 5363_1 and the gate driver circuit 5363_2 output gate signals to the gate lines 5372.

Figure 12B:
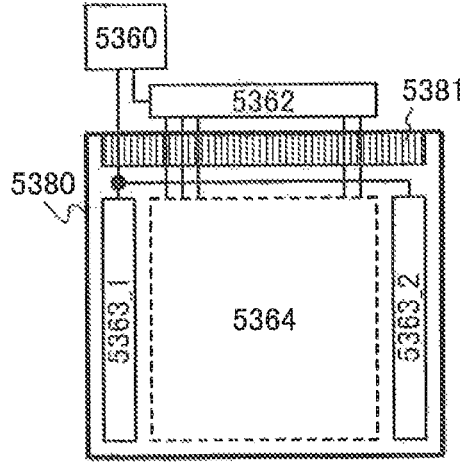

Note that in the display device shown in FIG. 12A, the gate driver circuit 5363_1 and the gate driver circuit 5363_2 can be formed over the same substrate as the pixel area 5364. FIG. 12B shows an example of the case where the gate driver circuit 5363_1 and the gate driver circuit 5363_2 are formed over the same substrate as the pixel area 5364 (a substrate 5380). Note that the substrate 5380 and an external circuit are connected to each other through a terminal 5381.

Figure 12C:
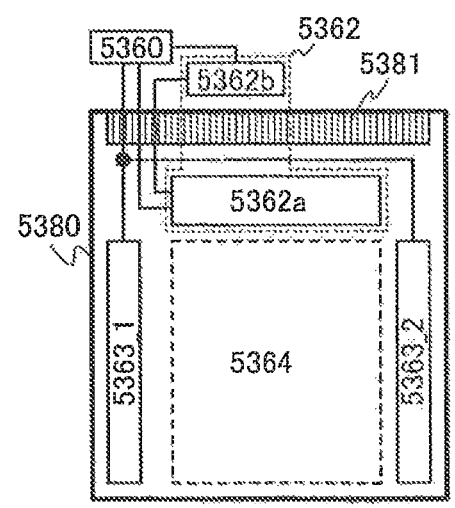

Note that in the display device shown in FIG. 12A, a part of the source driver circuit 5362 (e.g., a switch, a multiplexer, a shift register circuit, a decoder circuit, an inverter circuit, a buffer circuit, and/or a level shifter circuit) can be formed over the same substrate as the pixel area 5364. FIG. 12C shows an example of the case where the gate driver circuit 5363_1, the gate driver circuit 5363_2, a part of the source driver circuit 5362 (denoted by a reference numeral 5362a) are formed over the same substrate as the pixel area 5364 (the substrate 5380) and another part of the source driver circuit 5362 (denoted by a reference numeral 5362b) is formed over a substrate that is different from the substrate 5380.

The shift register circuit of Embodiment 2 can be used as the driver circuit of the display device or a part of the driver circuit. When the driver circuit of the display device includes the transistor of Embodiment 3 in particular, the usage of the shift register circuit in Embodiment 2 leads to improvement in the drive capability of the driver circuit. Thus, the display device can be made large. Alternatively, the resolution of the display area can be improved. Alternatively, the layout area of the driver circuit can be reduced, thereby reducing the frame size of the display device.

Embodiment 5

In this embodiment, examples of an electronic appliance will be described.

FIGS. 13A to 13H and FIGS. 14A to 14D illustrate electronic appliances. These electronic appliances can each include a housing 5000, a display area 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, smell, or infrared ray), a microphone 5008, and the like.

Figure 13A:
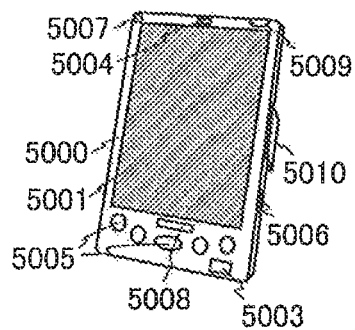
FIGS. 13A to 13H are diagrams showing devices embodying the technical idea of the present invention.
Figure 13B:
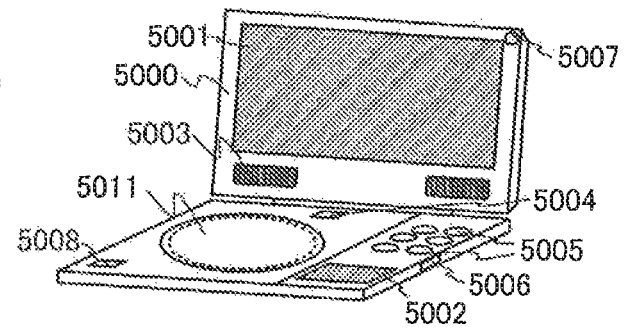
Figure 13C:
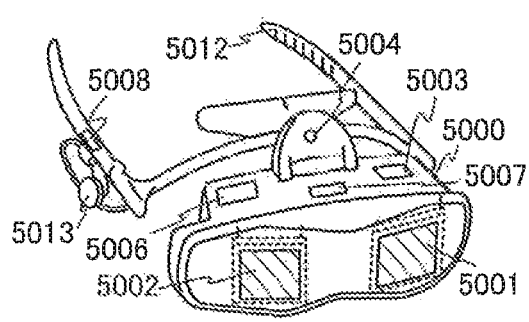
Figure 13D:
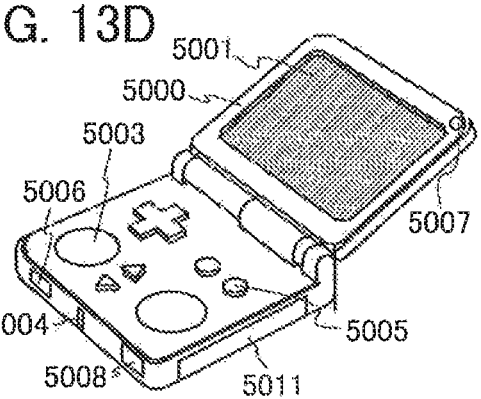
Figure 13E:
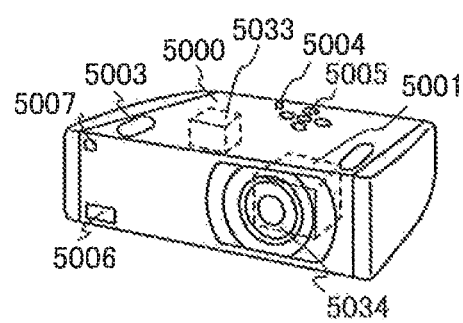
Figure 13F:
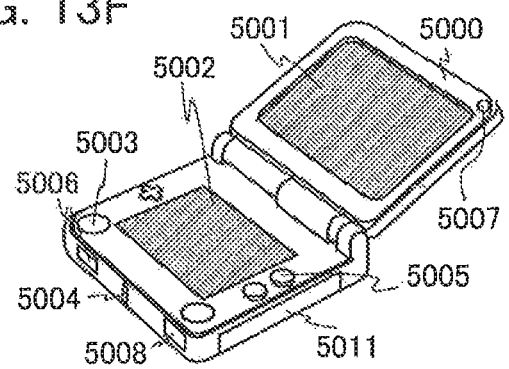
Figure 13G:
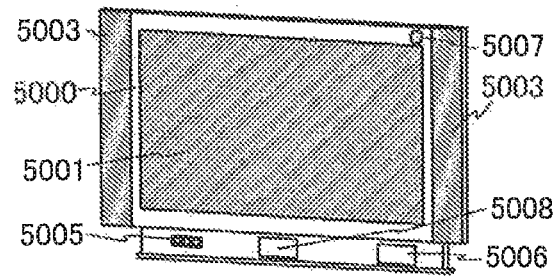
Figure 13H:
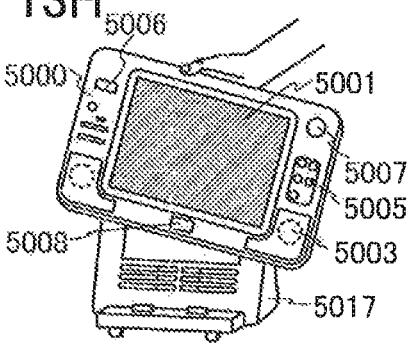
Figure 14A:
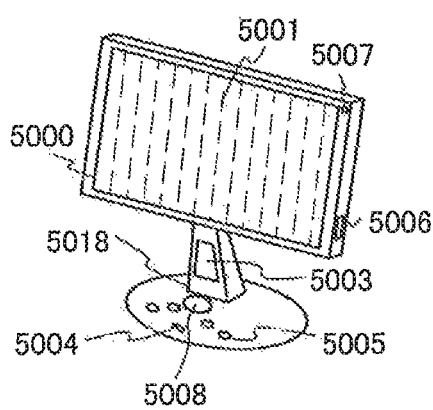
FIGS. 14A to 14H are diagrams showing devices embodying the technical idea of the present invention.
Figure 14B:
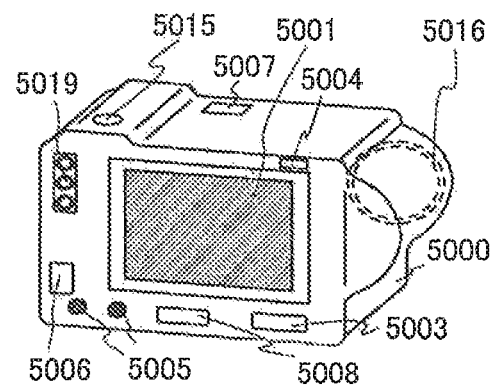
Figure 14C:
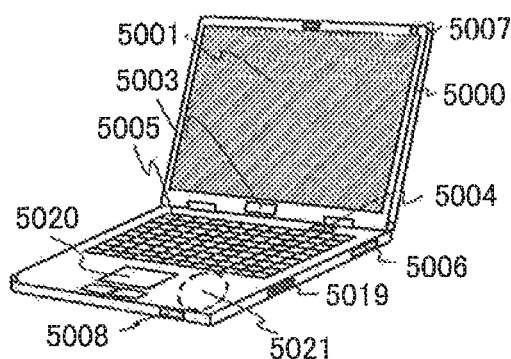
Figure 14D:
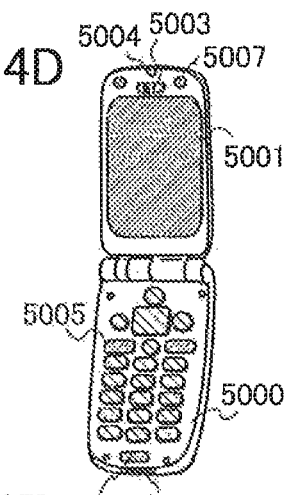

FIG. 13A shows a mobile computer which can include a switch 5009, an infrared port 5010, and the like in addition to the above objects. FIG. 13B shows a portable image reproducing device provided with a memory medium (e.g., a DVD reproducing device), which can include a second display area 5002, a memory medium read portion 5011, and the like in addition to the above objects. FIG. 13C shows a goggle-type display which can include the second display area 5002, a support 5012, an earphone 5013, and the like in addition to the above objects. FIG. 13D shows a portable game console which can include the memory medium read portion 5011 and the like in addition to the above objects. FIG. 13E shows a projector which can include a light source 5033, a projector lens 5034, and the like in addition to the above objects. FIG. 13F shows a portable game console which can include the second display area 5002, the memory medium read portion 5011, and the like in addition to the above objects. FIG. 13G shows a television receiver which can include a tuner, an image processing portion, and the like in addition to the above objects. FIG. 13H shows a portable television receiver which can include a charger 5017 capable of transmitting and receiving signals and the like in addition to the above objects. FIG. 14A shows a display which can include a support 5018 and the like in addition to the above objects. FIG. 14B shows a camera which can include an external connection port 5019, a shutter button 5015, an image reception portion 5016, and the like in addition to the above objects. FIG. 14C shows a computer which can include a pointing device 5020, the external connection port 5019, a reader/writer 5021, and the like in addition to the above objects. FIG. 14D shows a mobile phone which can include an antenna, a tuner of one-segment (1seg digital TV broadcasts) partial reception service for mobile phones and mobile terminals, and the like in addition to the above objects.

The electronic appliances shown in FIGS. 13A to 13H and FIGS. 14A to 14D can have a variety of functions, for example, a function of displaying a lot of information (e.g., a still image, a moving image, and a text image) on a display area; a touch panel function; a function of displaying a calendar, date, time, and the like; a function of controlling processing with a lot of software (programs); a wireless communication function; a function of being connected to a variety of computer networks with a wireless communication function; a function of transmitting and receiving a lot of data with a wireless communication function; a function of reading a program or data stored in a memory medium and displaying the program or data on a display area.

Further, the electronic appliance including a plurality of display areas can have a function of displaying image information mainly on one display area while displaying text information on another display area, a function of displaying a three-dimensional image by displaying images where parallax is considered on a plurality of display areas, or the like. Furthermore, the electronic appliance including an image receiving portion can have a function of photographing a still image, a function of photographing a moving image, a function of automatically or manually correcting a photographed image, a function of storing a photographed image in a memory medium (an external memory medium or a memory medium incorporated in the camera), a function of displaying a photographed image on the display area, or the like. Note that functions which can be provided for the electronic appliances shown in FIGS. 13A to 13H and FIGS. 14A to 14D are not limited to them, and the electronic appliances can have a variety of functions.

Figure 14E:
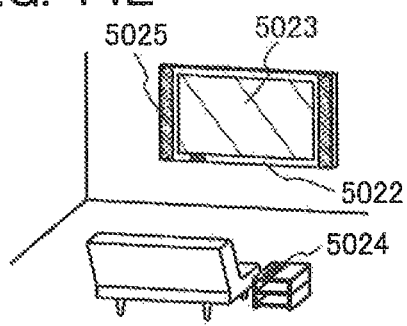

FIG. 14E shows an example in which a display device is incorporated in a building structure. FIG. 14E shows a housing 5022, a display area 5023, a remote control 5024 which is an operation portion, a speaker 5025, and the like. The display device is incorporated in the building structure in the form of a wall-hanging display and can be provided without requiring a large space.

Figure 14F:
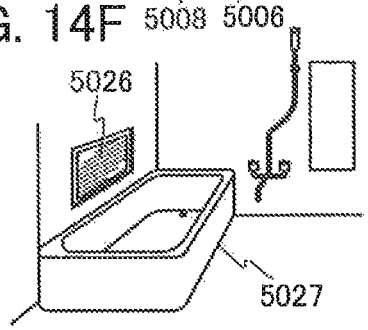

FIG. 14F shows another example in which a display device is incorporated in a building structure. A display panel 5026 is incorporated in a prefabricated bath unit 5027, so that a bather can watch TV or the like through the display panel 5026.

Note that although this embodiment describes the wall and the prefabricated bath unit as examples of the building structures, this embodiment is not limited to them: the display devices can be provided in a variety of building structures.

Next, examples in which display devices are incorporated in moving objects will be described.

Figure 14G:
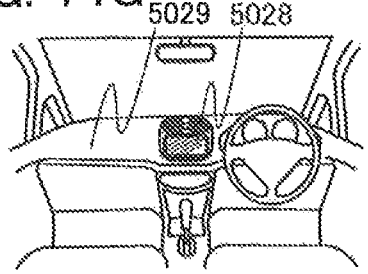

FIG. 14G shows an example in which a display device is incorporated in a car. A display panel 5028 is incorporated in a car body 5029 of the car and can display information related to the operation of the car or information inputted from inside or outside of the car on demand. Note that the display panel 5028 may have a navigation function.

Figure 14H:
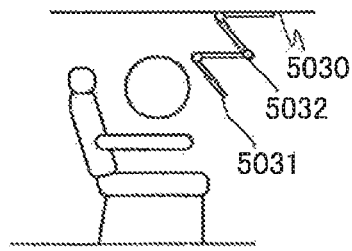

FIG. 14H shows an example in which a display device is incorporated in a passenger airplane. FIG. 14H shows a usage pattern when a display panel 5031 is provided to a ceiling 5030 above a seat of the passenger airplane. The display panel 5031 is incorporated in the ceiling 5030 through a hinge 5032, and a passenger can watch TV or the like through the display panel 5031 by stretching of the hinge 5032. The display panel 5031 is allowed by the control of the passenger to display information.

Note that although bodies of a car and an airplane are shown as examples of a moving object of this embodiment, this embodiment is not limited to them: the semiconductor devices can be provided to a variety of objects such as two-wheeled vehicles, four-wheeled vehicles (including cars, buses, and the like), trains (including monorails, railroads, and the like), and vessels.

The shift register circuit of Embodiment 2 is preferably incorporated in the electronic appliance of this embodiment. The shift register circuit of Embodiment 2 in particular is preferably incorporated as a circuit for driving the display area of the electronic appliance. When the shift register of Embodiment 2 is incorporated as a circuit for driving the display area of the electronic appliance, the area of a driver circuit can be reduced and the size of the display area can be increased. Further, the resolution of the display area can be improved.

This application is based on Japanese Patent Application serial No. 2010-036902 filed with Japan Patent Office on Feb. 23, 2010, the entire contents of which are hereby incorporated by reference.

The invention claimed is:

1. A semiconductor device comprising:
a first transistor;
a second transistor;
a third transistor;
a fourth transistor;
a fifth transistor;
a sixth transistor;
a seventh transistor; and
an eighth transistor,
wherein the first transistor, the second transistor, the third transistor, the fourth transistor, the fifth transistor, the sixth transistor, the seventh transistor, and the eighth transistor have the same conductivity type,
wherein one of a source and a drain of the first transistor is electrically connected to a first line and the other of the source and the drain of the first transistor is electrically connected to a second line,
wherein one of a source and a drain of the second transistor is electrically connected to the second line and the other of the source and the drain of the second transistor is electrically connected to a third line,
wherein one of a source and a drain of the third transistor is electrically connected to a gate of the first transistor, the other of the source and the drain of the third transistor is electrically connected to the third line, and a gate of the third transistor is electrically connected to a gate of the second transistor,
wherein one of a source and a drain of the fourth transistor is electrically connected to the gate of the first transistor, the other of the source and the drain of the fourth transistor is electrically connected to a fourth line, and a gate of the fourth transistor is electrically connected to the fourth line,
wherein one of a source and a drain of the fifth transistor is electrically connected to the gate of the first transistor, the other of the source and the drain of the fifth transistor is electrically connected to the fourth line, and a gate of the fifth transistor is electrically connected to a fifth line,
wherein one of a source and a drain of the sixth transistor is electrically connected to the gate of the first transistor, the other of the source and the drain of the sixth transistor is electrically connected to the third line, and a gate of the sixth transistor is electrically connected to a sixth line,
wherein one of a source and a drain of the seventh transistor is electrically connected to the second line, the other of the source and the drain of the seventh transistor is electrically connected to the third line, and a gate of the seventh transistor is electrically connected to the fifth line,
wherein one of a source and a drain of the eighth transistor is electrically connected to the second line, the other of the source and the drain of the eighth transistor is electrically connected to the third line, and a gate of the eighth transistor is electrically connected to the sixth line,
wherein the second line is configured to be supplied with a signal output from a circuit comprising the first transistor, the second transistor, the third transistor, the fourth transistor, the fifth transistor, the sixth transistor, the seventh transistor, and the eighth transistor,
wherein a ratio of a channel width to a channel length of the third transistor is smaller than a ratio of a channel width to a channel length of the fourth transistor,
wherein a ratio of a channel width to a channel length of the sixth transistor is smaller than the ratio of the channel width to the channel length of the fourth transistor, and
wherein a ratio of a channel width to a channel length of the eighth transistor is larger than a ratio of a channel width to a channel length of the second transistor.

2. The semiconductor device according to claim 1, wherein the first line is configured to be supplied with a first clock signal.

3. The semiconductor device according to claim 1,
wherein the first line is configured to be supplied with a first clock signal, and
wherein the fifth line is configured to be supplied with a second clock signal.

4. The semiconductor device according to claim 1,
wherein each of the first transistor, the second transistor, the third transistor, the fourth transistor, the fifth transistor, the sixth transistor, the seventh transistor, and the eighth transistor comprises an oxide semiconductor including In, Ga, and Zn.

5. The semiconductor device according to claim 1, wherein an off-state current of each of the first transistor, the second transistor, the third transistor, the fourth transistor, the fifth transistor, the sixth transistor, the seventh transistor, and the eighth transistor is 1 aA/μm or less.

6. The semiconductor device according to claim 1, wherein the circuit is included in a shift register of a liquid crystal display device.

7. A semiconductor device comprising:
a first transistor;
a second transistor;
a third transistor;
a fourth transistor;
a fifth transistor;
a sixth transistor;
a seventh transistor;
an eighth transistor; and
a ninth transistor,
wherein the first transistor, the second transistor, the third transistor, the fourth transistor, the fifth transistor, the sixth transistor, the seventh transistor, the eighth transistor, and the ninth transistor have the same conductivity type,
wherein one of a source and a drain of the first transistor is electrically connected to a first line and the other of the source and the drain of the first transistor is electrically connected to a second line,
wherein one of a source and a drain of the second transistor is electrically connected to the second line and the other of the source and the drain of the second transistor is electrically connected to a third line,
wherein one of a source and a drain of the third transistor is electrically connected to a gate of the first transistor, the other of the source and the drain of the third transistor is electrically connected to the third line, and a gate of the third transistor is electrically connected to a gate of the second transistor,
wherein one of a source and a drain of the fourth transistor is electrically connected to the gate of the first transistor, the other of the source and the drain of the fourth transistor is electrically connected to a fourth line, and a gate of the fourth transistor is electrically connected to the fourth line,
wherein one of a source and a drain of the fifth transistor is electrically connected to the gate of the first transistor, the other of the source and the drain of the fifth transistor is electrically connected to the fourth line, and a gate of the fifth transistor is electrically connected to a fifth line,
wherein one of a source and a drain of the sixth transistor is electrically connected to the gate of the first transistor, the other of the source and the drain of the sixth transistor is electrically connected to the third line, and a gate of the sixth transistor is electrically connected to a sixth line,
wherein one of a source and a drain of the seventh transistor is electrically connected to the second line, the other of the source and the drain of the seventh transistor is electrically connected to the third line, and a gate of the seventh transistor is electrically connected to the fifth line,
wherein one of a source and a drain of the eighth transistor is electrically connected to the second line, the other of the source and the drain of the eighth transistor is electrically connected to the third line, and a gate of the eighth transistor is electrically connected to the sixth line,
wherein one of a source and a drain of the ninth transistor is electrically connected to the gate of the second transistor, the other of the source and the drain of the ninth transistor is electrically connected to the third line, and a gate of the ninth transistor is electrically connected to the gate of the first transistor,
wherein the second line is configured to be supplied with a signal output from a circuit comprising the first transistor, the second transistor, the third transistor, the fourth transistor, the fifth transistor, the sixth transistor, the seventh transistor, the eighth transistor, and the ninth transistor,
wherein a ratio of a channel width to a channel length of the third transistor is smaller than a ratio of a channel width to a channel length of the fourth transistor,
wherein a ratio of a channel width to a channel length of the sixth transistor is smaller than the ratio of the channel width to the channel length of the fourth transistor, and
wherein a ratio of a channel width to a channel length of the eighth transistor is larger than a ratio of a channel width to a channel length of the second transistor.

8. The semiconductor device according to claim 7, wherein the first line is configured to be supplied with a first clock signal.

9. The semiconductor device according to claim 7,
wherein the first line is configured to be supplied with a first clock signal, and
wherein the fifth line is configured to be supplied with a second clock signal.

10. The semiconductor device according to claim 7,
wherein each of the first transistor, the second transistor, the third transistor, the fourth transistor, the fifth transistor, the sixth transistor, the seventh transistor, the eighth transistor, and the ninth transistor comprises an oxide semiconductor including In, Ga, and Zn.

11. The semiconductor device according to claim 7, wherein an off-state current of each of the first transistor, the second transistor, the third transistor, the fourth transistor, the fifth transistor, the sixth transistor, the seventh transistor, the eighth transistor, and the ninth transistor is 1 aA/μm or less.

12. The semiconductor device according to claim 7, wherein the circuit is included in a shift register of a liquid crystal display device.

* * * * *